(12) United States Patent
Kim et al.

(10) Patent No.: US 11,444,136 B2
(45) Date of Patent: Sep. 13, 2022

(54) DISPLAY DEVICE

(71) Applicant: SAMSUNG DISPLAY CO., LTD., Yongin-si (KR)

(72) Inventors: Soowon Kim, Cheonan-si (KR); Jaseung Ku, Seoul (KR); Yerin Oh, Ulsan (KR); Suhyun Jeong, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/237,946

(22) Filed: Apr. 22, 2021

(65) Prior Publication Data

US 2022/0069018 A1 Mar. 3, 2022

(30) Foreign Application Priority Data

Sep. 1, 2020 (KR) ........................ 10-2020-0111133

(51) Int. Cl.
*G06F 3/044* (2006.01)
*G06F 3/041* (2006.01)
*H01L 27/32* (2006.01)
*G09F 9/30* (2006.01)

(52) U.S. Cl.
CPC .......... *H01L 27/323* (2013.01); *G06F 3/0445* (2019.05); *G06F 3/04162* (2019.05); *G09F 9/301* (2013.01)

(58) Field of Classification Search
CPC ..... H01L 27/323; G09F 9/301; G06F 3/0445; G06F 3/04162; G06F 3/0446
See application file for complete search history.

(56) References Cited

U.S. PATENT DOCUMENTS

| | | |
|---|---|---|
| 9,501,191 B2 | 1/2016 | Kim |
| 9,569,041 B2 | 2/2017 | Son |
| 9,952,694 B2 * | 4/2018 | Kim .................... G06F 3/04166 |

(Continued)

FOREIGN PATENT DOCUMENTS

| | | |
|---|---|---|
| KR | 10-1608326 | 4/2016 |
| KR | 10-1995403 | 7/2019 |

(Continued)

*Primary Examiner* — Lisa S Landis
(74) *Attorney, Agent, or Firm* — F. Chau & Associates, LLC

(57) ABSTRACT

A display device includes a display panel, and an input sensing part disposed on the display panel. The input sensing part includes a first main electrode, a first sub-electrode adjacent to the first main electrode, a second main electrode and insulated from the first main electrode and the first sub-electrode, the second main electrode overlapping the first main electrode and the first sub-electrode, a second sub-electrode adjacent to the second main electrode, and insulated from the first main electrode and the first sub-electrode, the second sub-electrode overlapping the first main electrode and the first sub-electrode, a first group of switches selectively connecting a transmission line and one of the first main electrode and the first sub-electrode with each other, and a second group of switches selectively connecting a receiving line and one of the second main electrode and the second sub-electrode with each other.

20 Claims, 17 Drawing Sheets

(56) References Cited

U.S. PATENT DOCUMENTS

| | | | |
|---|---|---|---|
| 2016/0004368 A1* | 1/2016 | Kurasawa | G06F 3/04166 345/174 |
| 2019/0317641 A1* | 10/2019 | Maruyama | G01L 1/2262 |
| 2020/0110484 A1 | 4/2020 | Kim et al. | |
| 2021/0373703 A1 | 12/2021 | Cho et al. | |

FOREIGN PATENT DOCUMENTS

| | | |
|---|---|---|
| KR | 10-2068588 | 2/2020 |
| KR | 10-2020-0039889 | 4/2020 |
| KR | 10-2021-0148535 | 12/2021 |

* cited by examiner

DISPLAY DEVICE

CROSS-REFERENCE TO RELATED APPLICATION

This U.S. non-provisional patent application claims priority under 35 U.S.C. § 119 of Korean Patent Application No. 10-2020-0111133, filed on Sep. 1, 2020, the contents of which are hereby incorporated by reference in its entirety.

BACKGROUND

1. Field of Disclosure

The present inventive concept relates to a display device having an improved sensing reliability.

2. Description of the Related Art

Multimedia electronic devices, such as televisions, mobile phones, tablet computers, navigation units, and game units, include a display device to display an image. The electronic devices include an input sensor that provides a touch-based input method allowing users to easily and intuitively input information or commands in addition to the usual input methods, such as a button, a keyboard, a mouse, etc.

The input sensor senses touch or pressure with the user's body. Meanwhile, there is an increasing demand for the use of an active pen for users who are familiar with the input of information with a writing instrument or for precise touch input for a specific application, for example, an application program for sketching or drawing.

SUMMARY

The present disclosure provides a display device capable of more accurately sensing an input by a touch pen.

According to an embodiment of the present inventive concept, a display device includes a display panel, and an input sensing part disposed on the display panel. The input sensing part includes a first main electrode extending lengthwise in a first direction, a first sub-electrode extending lengthwise in the first direction and being adjacent to the first main electrode, a second main electrode extending lengthwise in a second direction different from the first direction and insulated from the first main electrode and the first sub-electrode, the second main electrode overlapping the first main electrode and the first sub-electrode, a second sub-electrode extending lengthwise in the second direction, disposed adjacent to the second main electrode, and insulated from the first main electrode and the first sub-electrode, the second sub-electrode overlapping the first main electrode and the first sub-electrode, a first group of switches selectively connecting a transmission line and one of the first main electrode and the first sub-electrode with each other, and a second group of switches selectively connecting a receiving line and one of the second main electrode and the second sub-electrode with each other.

According to an embodiment of the present inventive concept, a display device includes a display panel, and an input sensing part disposed on the display panel. The input sensing part includes a first main electrode extending lengthwise in a first direction, a plurality of first sub-electrodes extending lengthwise in the first direction and disposed adjacent to the first main electrode, a second main electrode extending lengthwise in a second direction different from the first direction and insulated from the first main electrode and the plurality of first sub-electrodes, the second main electrode overlapping the first main electrode and the plurality of first sub-electrodes, a plurality of second sub-electrodes extending lengthwise in the second direction, disposed adjacent to the second main electrode, and insulated from the first main electrode and the plurality of first sub-electrodes, the plurality of second sub-electrodes overlapping the first main electrode and the plurality of first sub-electrodes, a first transmission line connected to the first main electrode, a first receiving line connected to the second main electrode, a first group of switches selectively connecting a second transmission line and one of the plurality of first sub-electrodes with each other, and a second group of switches selectively connecting a second receiving line and one of the plurality of second sub-electrodes with each other.

According to the above, since the uplink signal is transmitted through the sub-electrodes in a small area, a noise occurring in the display panel may be reduced compared with when the uplink signal is transmitted to the display panel through the main electrodes.

Since a coordinate of a position of the touch pen is calculated using the main electrodes and the sub-electrodes, a coordinate accuracy of the touch pen may be improved. Thus, a sensing reliability of the display device may be improved.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
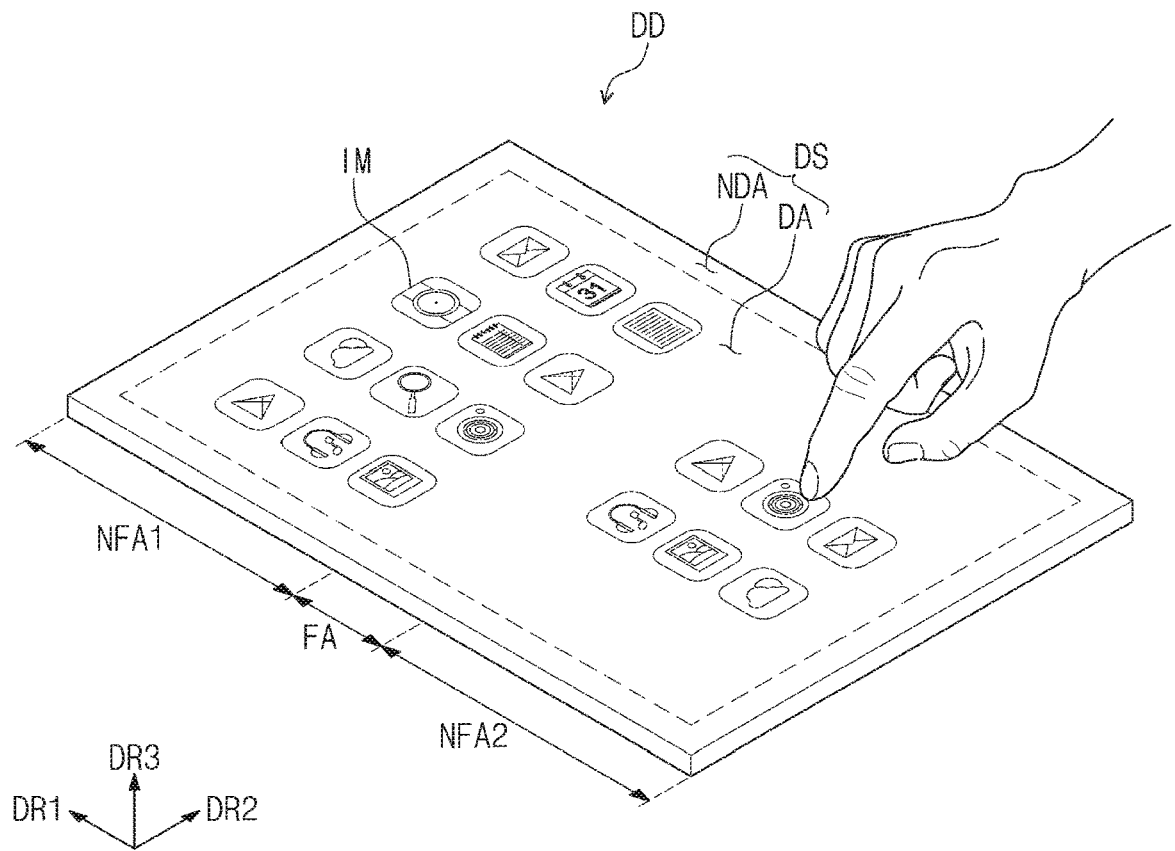
FIG. 1 is a perspective view showing a display device according to an embodiment of the present inventive concept.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

Figure 2:
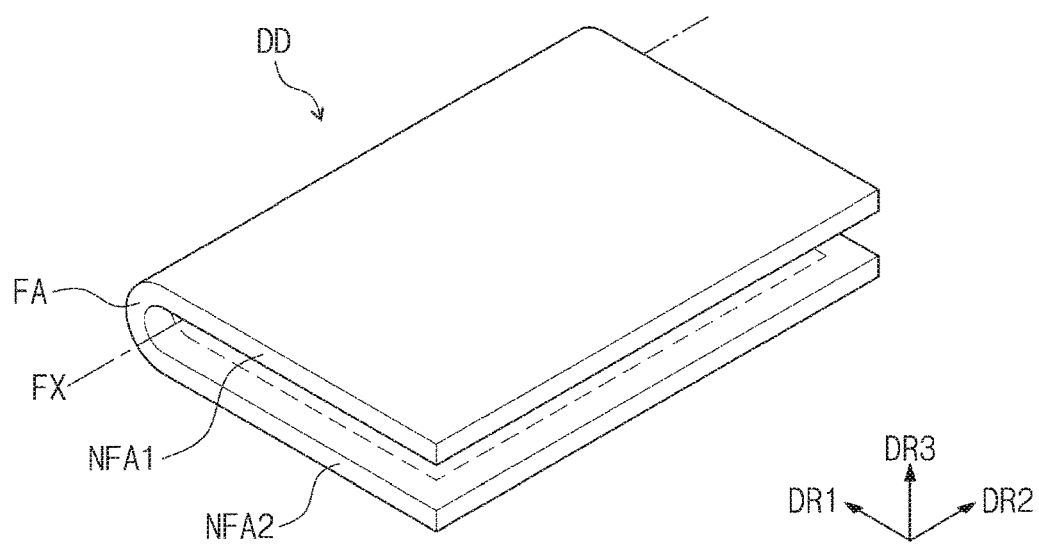
FIG. 2 is a perspective view showing a folded state of the display device shown in FIG. 1 according to an embodiment of the present inventive concept.

FIG. 1 is a perspective view showing a display device DD according to an embodiment of the present disclosure, and FIG. 2 is a perspective view showing a folded state of the display device DD shown in FIG. 1.

Referring to FIG. 1, the display device DD according to the embodiment of the present disclosure may have a rectangular shape defined by long sides extending in a first direction DR1 and short sides extending in a second direction DR2 crossing the first direction DR1. However, the shape of the display device DD is not limited to the rectangular shape, and the display device DD may have various shapes, such as a circular shape and a polygonal shape. The display device DD may be a flexible display device.

Hereinafter, a direction substantially perpendicular to a surface defined by the first direction DR1 and the second direction DR2 may be referred to as a "third direction DR3". In the present disclosure, the expression "viewed in the plan" may mean a state of being viewed in the third direction DR3.

The display device DD may include a folding area FA and a plurality of non-folding areas NFA1 and NFA2. The non-folding areas NFA1 and NFA2 may include a first non-folding area NFA1 and a second non-folding area NFA2 which are spaced apart from each other. The folding area FA may be disposed between the first non-folding area NFA1 and the second non-folding area NFA2. The second non-folding area NFA2, the folding area FA, and the first non-folding area NFA1 may be arranged in the first direction DR1.

For example, one folding area FA and two non-folding areas NFA1 and NFA2 are shown as a representative example. However, the number of the folding areas FA and the number of non-folding areas NFA1 and NFA2 is not limited thereto. For example, the display device DD may include more than two non-folding areas and a plurality of folding areas disposed between the non-folding areas.

An upper surface of the display device DD may be referred to as a "display surface DS" and may be a plane surface defined by the first direction DR1 and the second direction DR2. Images IM generated by the display device DD may be provided to a user through the display surface DS.

The display surface DS may include a display area DA and a non-display area NDA around the display area DA. The display area DA displays the image, and the non-display area NDA does not display the image. The non-display area NDA surrounds the display area DA and defines an edge of the display device DD, which is printed by a predetermined color.

Referring to FIG. 2, the display device DD may be, but not limited to, a foldable display device DD that is folded or unfolded while in use. For example, the folding area FA may be folded about a folding axis FX substantially parallel to the second direction DR2, and thus, the display device DD may be folded. The folding axis FX may be defined as a minor axis substantially parallel to the short sides of the display device DD.

When the display device DD is folded, the first non-folding area NFA1 and the second non-folding area NFA2 face each other, and thus, the display device DD may be inwardly folded (in-folding) such that the display surface DS is not exposed to the outside.

Figure 3:
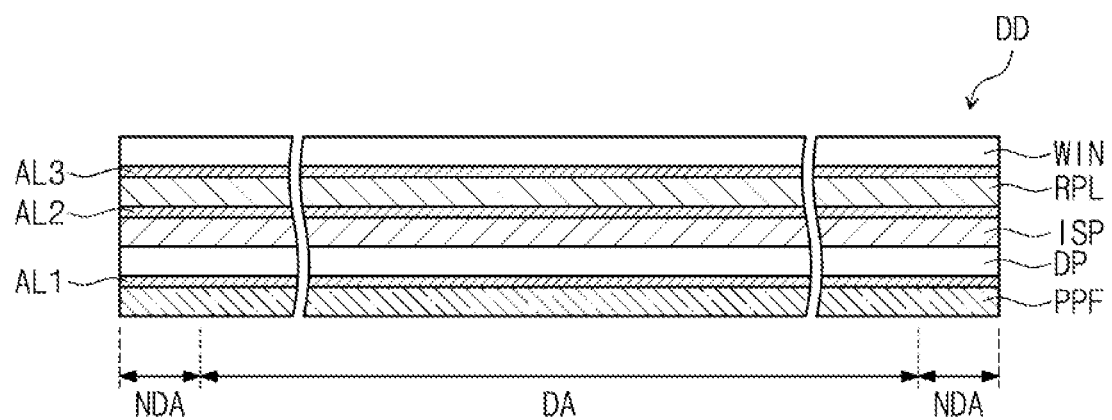
FIG. 3 is a cross-sectional view showing the display device shown in FIG. 1 according to an embodiment of the present inventive concept.
Figure 3:
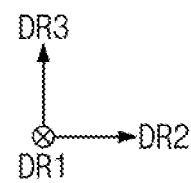

FIG. 3 is a cross-sectional view showing the display device DD shown in FIG. 1.

As an example, FIG. 3 shows a cross-section of the display device DD when viewed in the first direction DR1.

Referring to FIG. 3, the display device DD may include a display panel DP, an input sensing part ISP, an anti-reflective layer RPL, a window WIN, a panel protective film PPF, and first, second, and third adhesive layers AL1, AL2, and AL3.

The display panel DP may be a flexible display panel. The display panel DP may be a light-emitting type display panel. The present inventive concept, however, is not limited thereto. In an embodiment, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as a representative example of the display panel DP.

The input sensing part ISP may be disposed on the display panel DP. The input sensing part ISP may include a plurality of sensors (not shown) to sense an external input (e.g., a finger touch or a pen input) by a capacitive method. The input sensing part ISP may be manufactured directly on the display panel DP when the display device is manufactured. However, the present inventive concept is not be limited thereto. In an embodiment, the input sensing part ISP may be attached to the display panel DP by an adhesive after being manufactured separately from the display panel DP.

The anti-reflective layer RPL may be disposed on the input sensing part ISP. The anti-reflective layer RPL may reduce a reflectance of an external light incident to the display panel DP from the above of the display device DD. In an embodiment, the anti-reflective layer RPL may include a retarder and/or a polarizer.

The window WIN may be disposed on the anti-reflective layer RPL. The window WIN may protect the display panel DP, the input sensing part ISP, and the anti-reflective layer RPL from external scratches and impacts.

The panel protective film PPF may be disposed under the display panel DP. The panel protective film PPF may protect a lower portion of the display panel DP. The panel protective film PPF may include a flexible plastic material such as polyethylene terephthalate (PET).

The first adhesive layer AL1 may be disposed between the display panel DP and the panel protective film PPF. The display panel DP and the panel protective film PPF may be coupled to each other by the first adhesive layer AL1.

The second adhesive layer AL2 may be disposed between the anti-reflective layer RPL and the input sensing part ISP. The anti-reflective layer RPL and the input sensing part ISP may be coupled to each other by the second adhesive layer AL2.

The third adhesive layer AL3 may be disposed between the window WIN and the anti-reflective layer RPL. The window WIN and the anti-reflective layer RPL may be coupled to each other by the third adhesive layer AL3.

Figure 4:
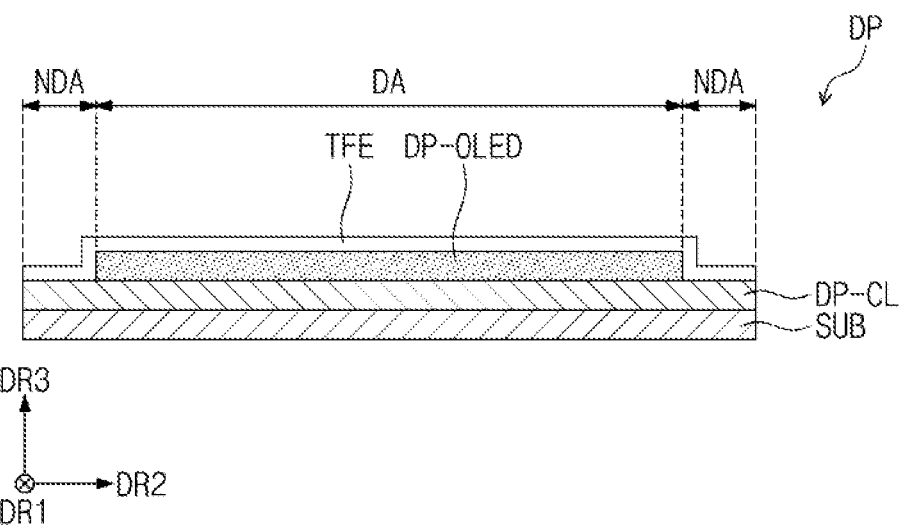
FIG. 4 is a cross-sectional view showing a display panel shown in FIG. 3 according to an embodiment of the present inventive concept.

FIG. 4 is a cross-sectional view showing the display panel DP shown in FIG. 3.

As an example, FIG. 4 shows a cross-section of the display panel DP when viewed in the first direction DR1.

Referring to FIG. 4, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include the display area DA and the non-display area NDA around the display area DA. The substrate SUB may include a flexible plastic material. For example, the substrate SUB may include polyimide (PI). The display element layer DP-OLED may be disposed in the display area DA.

A plurality of pixels may be disposed in the circuit element layer DP-CL and the display element layer DP-OLED. Each pixel may include two or more transistors and a light emitting element disposed on the display element layer DP-OLED and connected to the transistors. The pixel will be described in detail later.

The thin film encapsulation layer TFE may be disposed on the circuit element layer DP-CL to cover the display element layer DP-OLED. The thin film encapsulation layer TFE may include inorganic layers and organic layers disposed between the inorganic layers. The inorganic layers may protect the pixels from moisture and oxygen. The organic layers may protect the pixel from a foreign substance such as dust particles.

Figure 5:
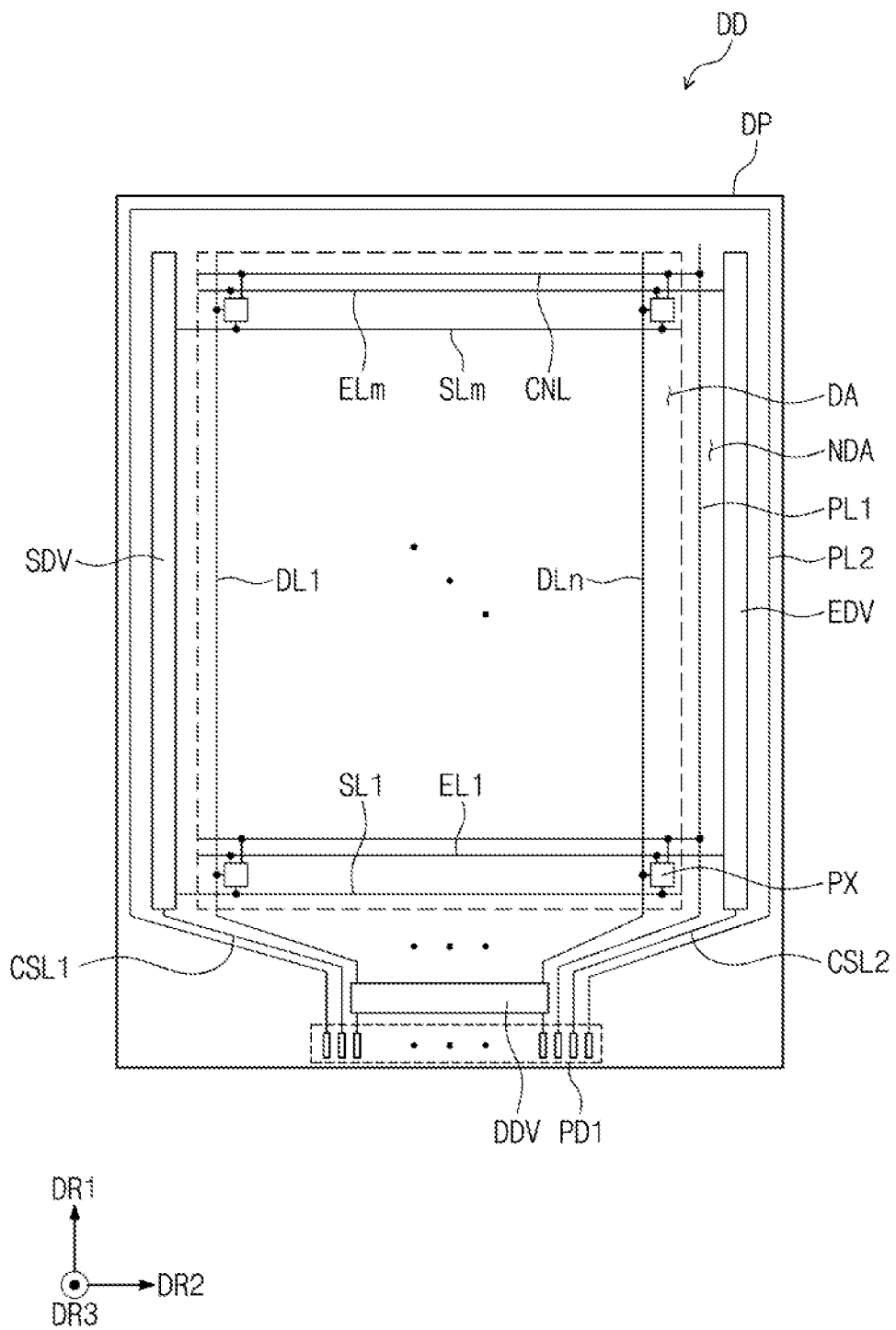
FIG. 5 is a plan view showing the display panel shown in FIG. 3 according to an embodiment of the present inventive concept.

FIG. 5 is a plan view showing the display panel DP shown in FIG. 3.

Referring to FIG. 5, the display device DD may include the display panel DP, a scan driver SDV, a data driver DDV, an emission driver EDV, and a plurality of first pads PD1.

The display panel DP may have a rectangular shape having long sides extending in the first direction DR1 and short sides extending in the second direction DR2. The shape of the display panel DP, however, is not limited thereto. The display panel DP may include the display area DA and the non-display area NDA surrounding the display area DA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, first and second power lines PL1 and PL2, and connection lines CNL. Each of "m" and "n" is a natural number.

The pixels PX may be arranged in the display area DA. The scan driver SDV and the emission driver EDV may be disposed in the non-display area NDA to be respectively adjacent to the long sides of the display panel DP. The data driver DDV may be disposed in the non-display area NDA to be adjacent to one short side of the short sides of the display panel DP. When the display device DD is viewed in a plan view, the data driver DDV may be disposed to be adjacent to a lower end of the display panel DP.

The scan lines SL1 to SLm may extend lengthwise in the second direction DR2 and may be connected to the pixels PX and the scan driver SDV. The data lines DL1 to DLn may extend lengthwise in the first direction DR1 and may be connected to the pixels PX and the data driver DDV. The emission lines EL1 to ELm may extend lengthwise in the second direction DR2 and may be connected to the pixels PX and the emission driver EDV.

The first power line PL1 may extend lengthwise in the first direction DR1 and may be disposed in the non-display area NDA. The first power line PL1 may be disposed between the display area DA and the emission driver EDV. The present inventive concept, however, is not limited thereto. In an embodiment, the first power line PL1 may be disposed between the display area DA and the scan driver SDV.

The connection lines CNL may extend lengthwise in the second direction DR2 and may be spaced apart from each other in the first direction DR1. The connection lines CNL may be connected to the first power line PL1 and the pixels PX. A first voltage may be applied to the pixels PX through the first power line PL1 and the connection lines CNL connected to the first power line PL1.

The second power line PL2 may be disposed in the non-display area NDA. The second power line PL2 may extend along the long sides of the display panel DP and a short side at which the data driver DDV is not disposed in the display panel DP. The second power line PL2 may be disposed outside the scan driver SDV and the emission driver EDV.

Although not shown in figures, the second power line PL2 may extend to the display area DA and may be connected to the pixels PX. A second voltage having a level lower than that of the first voltage may be applied to the pixels PX through the second power line PL2.

The first control line CSL1 may be connected to the scan driver SDV and may extend toward a lower end of the display panel DP when the display device DD is viewed in a plan view. The second control line CSL2 may be connected to the emission driver EDV and may extend toward the lower end of the display panel DP when the display device DD is viewed in a plan view. The data driver DDV may be disposed between the first control line CSL1 and the second control line CSL2.

The first pads PD1 may be disposed on the display panel DP. The first pads PD1 may be closer to the lower end of the display panel DP than the data driver DDV is. The data driver DDV, the first power line PL1, the second power line PL2, the first control line CSL1, and the second control line CSL2 may be connected to the first pads PD1. The data lines DL1 to DLn may be connected to the data driver DDV, and the data driver DDV may be connected to the first pads PD1 corresponding to the data lines DL1 to DLn.

Although not shown in figures, the display device DD may further include a timing controller to control an operation of the scan driver SDV, the data driver DDV, and the emission driver EDV and a voltage generator to generate the first and second voltages. The timing controller and the voltage generator may be connected to corresponding first pads PD1 through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may receive the data voltages in response to the scan signals. The pixels PX may emit a light having a luminance corresponding to the data voltages in response to the emission signals, and thus, the image may be displayed. An emission time of the pixels PX may be controlled by the emission signals.

Figure 6:
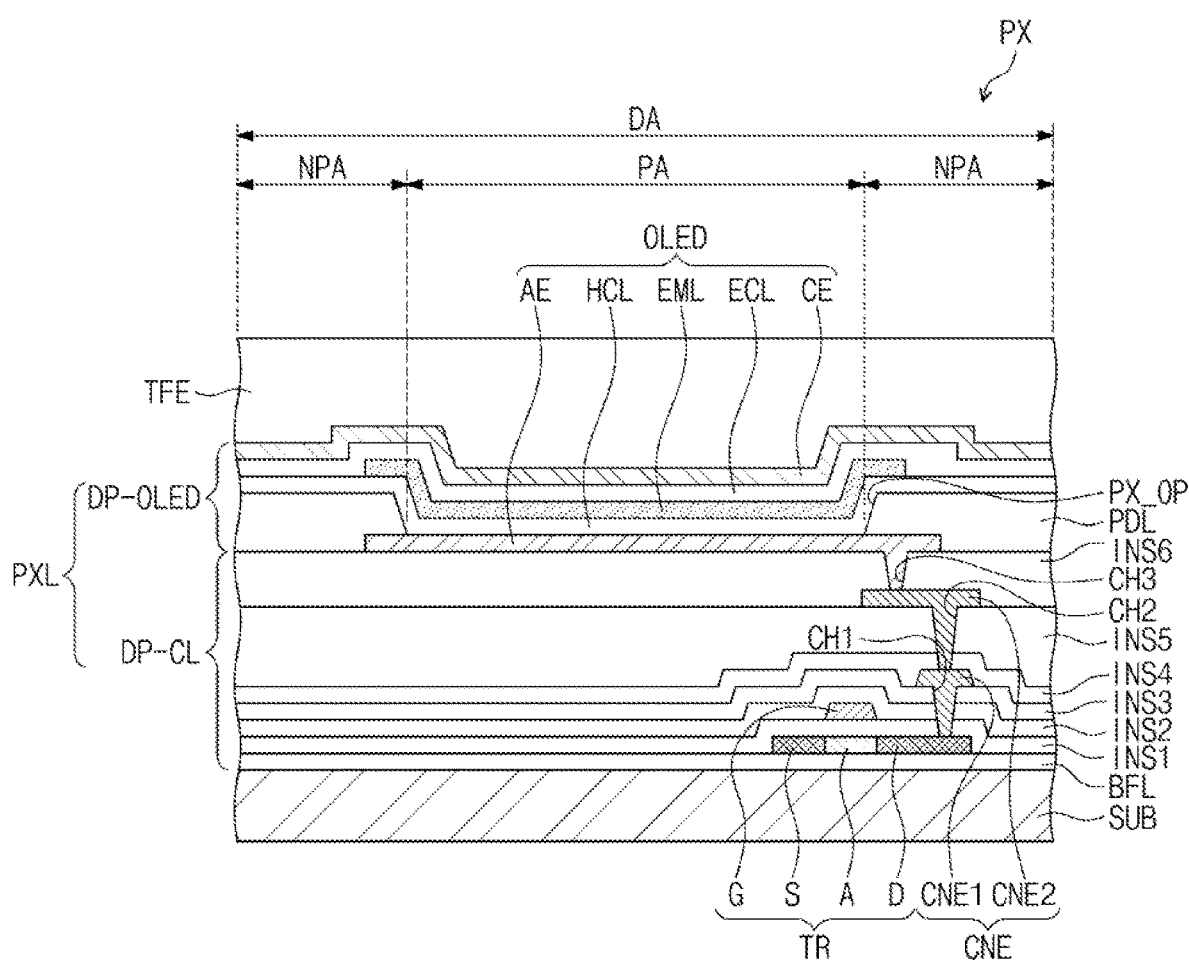
FIG. 6 is a cross-sectional view showing a pixel shown in FIG. 5 according to an embodiment of the present inventive concept.

FIG. 6 is a cross-sectional view showing the pixel PX shown in FIG. 5.

Referring to FIG. 6, the pixel PX may be disposed on a substrate SUB and may include a transistor TR and a light emitting element OLED. The light emitting element OLED may include a first electrode AE, a second electrode CE, and a hole control layer HCL, an electron control layer ECL, and a light emitting layer EML. The first electrode AE may be an anode electrode, and the second electrode CE may be a cathode electrode.

The transistor TR and the light emitting element OLED may be disposed on the substrate SUB. For the simplicity of drawings, one transistor TR is shown in FIG. 6. However, the pixel PX may include a plurality of transistors and at least one capacitor to drive the light emitting element OLED.

The display area DA may include a light emitting area PA corresponding to each pixel PX and a non-light-emitting area NPA around the light emitting area PA. The light emitting element OLED may be disposed in the light emitting area PA.

The substrate SUB may include a flexible plastic material. In an embodiment, the substrate SUB may include transparent polyimide PI. A buffer layer BFL may be disposed on the substrate SUB, and the buffer layer BFL may be an inorganic layer. A semiconductor pattern may be disposed on the buffer layer BFL. The semiconductor pattern may include or may be formed of a polycrystalline silicon. The present inventive concept, however, is not limited thereto. In an embodiment, the semiconductor pattern may include or may be formed of amorphous silicon or metal oxide.

The semiconductor pattern may be doped with an N-type dopant or a P-type dopant. The semiconductor pattern may have different electrical properties depending on whether it is doped with the P-type dopant or the N-type dopant. The semiconductor pattern may include a high-doped region and a low-doped region. The high-doped region may have a conductivity greater than that of the low-doped region and may substantially serve as a source electrode and a drain electrode of the transistor TR. The low-doped region may substantially correspond to an active (or channel) of the transistor TR.

A source S, an active A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may be disposed between the transistor TR and the light emitting element OLED to connect the transistor TR to the light emitting element OLED. The connection electrode CNE may include a first connection electrode CNE1 and a second connection electrode CNE2.

The first connection electrode CNE1 may be disposed on the third insulating layer INS3 and may be connected to the drain D through a first contact hole CH1 defined through the first, second, and third insulating layers INS1, INS2, and INS3. A fourth insulating layer INS4 may be disposed on the first connection electrode CNE1. A fifth insulating layer INS5 may be disposed on the fourth insulating layer INS4.

The second connection electrode CNE2 may be disposed on the fifth insulating layer INS5 and may be connected to the first connection electrode CNE1 through a second contact hole CH2 defined through the fourth insulating layer INS4 and the fifth insulating layer INS5. A sixth insulating layer INS6 may be disposed on the second connection electrode CNE2. Each of the first to sixth insulating layers INS1 to INS6 may be an inorganic layer or an organic layer.

The first electrode AE may be disposed on the sixth insulating layer INS6. The first electrode AE may be connected to the second connection electrode CNE2 through a third contact hole CH3 defined through the sixth insulating layer INS6. A pixel definition layer PDL may be disposed on the first electrode AE and the sixth insulating layer INS6 to expose a predetermined portion of the first electrode AE. The pixel definition layer PDL may be provided with an opening PX_OP defined therethrough to expose the portion of the first electrode AE.

The hole control layer HCL may be disposed on the first electrode AE and the pixel definition layer PDL. The hole control layer HCL may be commonly disposed in the light emitting area PA and the non-light-emitting area NPA. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate a light having one of a plurality of colors including, without being limited to, red, green, and blue colors.

The electron control layer ECL may be disposed on the light emitting layer EML and the hole control layer HCL. The electron control layer ECL may be commonly disposed in the light emitting area PA and the non-light-emitting area NPA. The electron control layer ECL may include an electron transport layer and an electron injection layer.

The second electrode CE may be disposed on the electron control layer ECL. The second electrode CE may be commonly disposed in the pixels PX. Layers from the buffer layer BFL to the light emitting element OLED may be collectively referred to as a pixel layer PXL.

A thin film encapsulation layer TFE may be disposed on the light emitting element OLED. The thin film encapsulation layer TFE may be disposed on the second electrode CE to cover the pixel PX. The thin film encapsulation layer TFE may include a first encapsulation layer disposed on the second electrode CE, a second encapsulation layer disposed on the first encapsulation layer, and a third encapsulation layer disposed on the second encapsulation layer.

Each of the first and third encapsulation layers may be an inorganic layer, and the second encapsulation layer may be an organic layer. The first and third encapsulation layers may protect the pixel PX from moisture and oxygen. The second encapsulation layer may protect the pixel PX from a foreign substance such as dust particles.

The first voltage may be applied to the first electrode AE through the transistor TR, and the second voltage, which has a voltage level lower than that of the first voltage, may be applied to the second electrode CE. Holes and electrons injected into the light emitting layer EML may be recombined to generate excitons, and the light emitting element OLED may emit the light by the excitons when returning to a ground state from an excited state.

Figure 7:
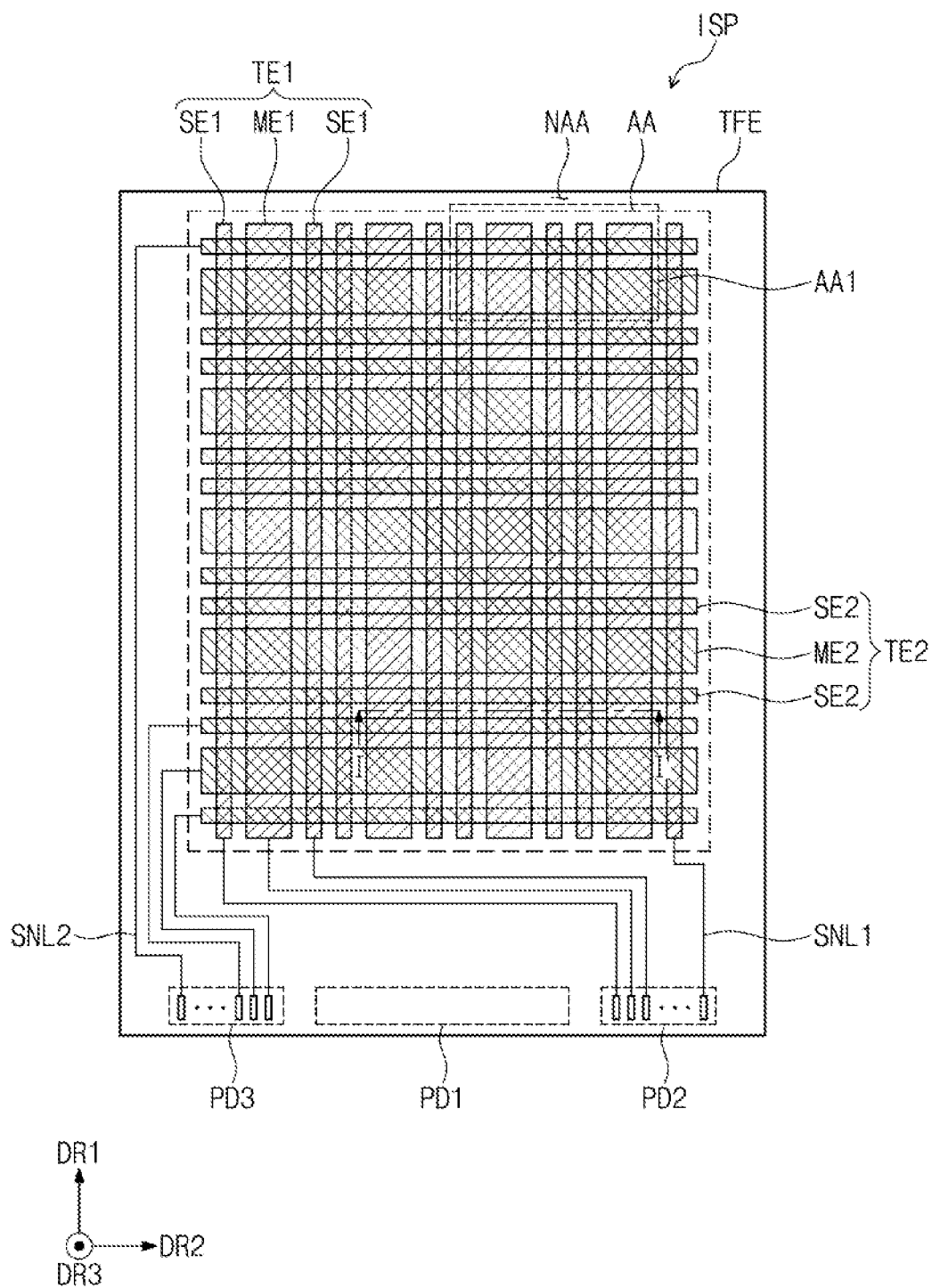
FIG. 7 is a plan view showing an input sensing part shown in FIG. 3 according to an embodiment of the present inventive concept.

FIG. 7 is a plan view showing an input sensing part ISP shown in FIG. 3.

Referring to FIG. 7, the input sensing part ISP may include a plurality of first and second sensing electrodes TE1 and TE2, a plurality of first and second lines SNL1 and SNL2, and a plurality of second and third pads PD2 and PD3. The first and second sensing electrodes TE1 and TE2, the first and second lines SNL1 and SNL2, and the second and third pads PD2 and PD3 may be disposed on the thin film encapsulation layer TFE.

The input sensing part ISP may include an active area AA and a non-active area NAA around the active area AA. The active area AA may overlap the display area DA, and the non-active area NAA may overlap the non-display area NDA. The first and second sensing electrodes TE1 and TE2 may be disposed in the active area AA, and the second and third pads PD2 and PD3 may be disposed in the non-active area NAA.

The first and second lines SNL1 and SNL2 may be connected to one ends of the first and second sensing electrodes TE1 and TE2, may extend to the non-active area NAA, and may be connected to the second and third pads PD2 and PD3. Although not shown in figures, the second and third pads PD2 and PD3 may be connected to the printed circuit board. The group of switches and the sensing controller may be connected to the second and third pads PD2 and PD3 through the printed circuit board.

The first and second sensing electrodes TE1 and TE2 may include a plurality of first sensing electrodes TE1 extending lengthwise in the first direction DR1 and being spaced apart from each other in the second direction DR2, and a plurality of second sensing electrodes TE2 extending lengthwise in the second direction DR2 and being spaced apart from each other in the first direction DR1, respectively. The second sensing electrodes TE2 may be insulated from the first sensing electrodes TE1 while overlapping the first sensing electrodes TE1.

The first lines SNL1 may be connected to the second pads PD2. The second lines SNL2 may be connected to the third pads PD3.

The first sensing electrodes TE1 may be defined as input sensing electrodes, and the second sensing electrodes TE2 may be defined as output sensing electrodes. The input sensing part ISP may be operated in a mutual sensing mode. For example, driving signals are applied to the first sensing electrodes TE1 through the first lines SNL1, and sensing signals may be output from the second sensing electrodes TE2 through the second lines SNL2. The driving signals may be sequentially applied to the first sensing electrodes TE1.

Although not shown in figures, a touch driving controller may be disposed outside of the input sensing part ISP to control an operation of the input sensing part ISP. The touch driving controller may provide the driving signals and may receive sensing signals to calculate a touched position. The touch driving controller may include a group of switches. The group of switches will be described in detail later with reference to FIGS. 13A and 13B. The touch driving controller will be described in detail later with reference to FIGS. 14A and 14B.

The first sensing electrodes TE1 may include a plurality of first main electrodes ME1 and a plurality of first sub-electrodes SE1. The first main electrodes ME1 may extend lengthwise in the first direction DR1 and may be spaced apart from each other in the second direction DR2. The first sub-electrodes SE1 may extend lengthwise in the first direction DR1. Each of the first main electrodes ME1 may be interposed between corresponding two adjacent first sub-electrodes SE1. The first main electrodes ME1 may have a width, in the second direction DR2, greater than a width, in the second direction DR2, of the first sub-electrodes SE1.

Each of the first sensing electrodes TE1 may include a first main electrode ME1 and two first sub-electrodes SE1. The first main electrode ME1 may be disposed between the first sub-electrodes SE1. The second sensing electrodes TE2 may include a plurality of second main electrodes ME2 and a plurality of second sub-electrodes SE2. The second main electrodes ME2 may extend lengthwise in the second direction DR2 and may be spaced apart from each other in the first direction DR1. Each of the second main electrodes ME2 may be interposed between corresponding two second sub-electrodes SE2. The second main electrodes ME2 may have a width, in the first direction DR1, greater than a width, in the first direction DR1, of the second sub-electrodes SE2. The second main electrodes ME2 may be insulated from the first main electrodes ME1 and the first sub-electrodes SE1 while overlapping the first main electrodes ME1 and the first sub-electrodes SE1. The second sub-electrodes SE2 may be insulated from the first main electrodes ME1 and the first sub-electrodes SE1 while overlapping the first main electrodes ME1 and the first sub-electrodes SE1.

Each of the second sensing electrodes TE2 may include a second main electrode ME2 and two second sub-electrodes SE2. The second main electrode ME2 may be disposed between the second sub-electrodes SE2.

For the simplicity of drawings, four first sensing electrodes TE1 and five second sensing electrodes TE2 are shown in FIG. 7. The present inventive concept, however, is not limited thereto.

The first sensing electrodes TE1 and the second sensing electrodes TE2 may be disposed in different layers from each other. The present inventive concept, however, is not limited thereto. In an embodiment, the first sensing electrodes TE1 and the second sensing electrodes TE2 may be disposed in the same layer as each other. The first sensing electrodes TE1 and the second sensing electrodes TE2 do not overlap each other, and the first sensing electrodes TE1 may be connected to each other by a bridge pattern. The first sensing electrodes TE1 and the second sensing electrodes TE2, which are disposed in the same layer, will be described in detail later with reference to FIGS. 10 and 11.

Figure 8:
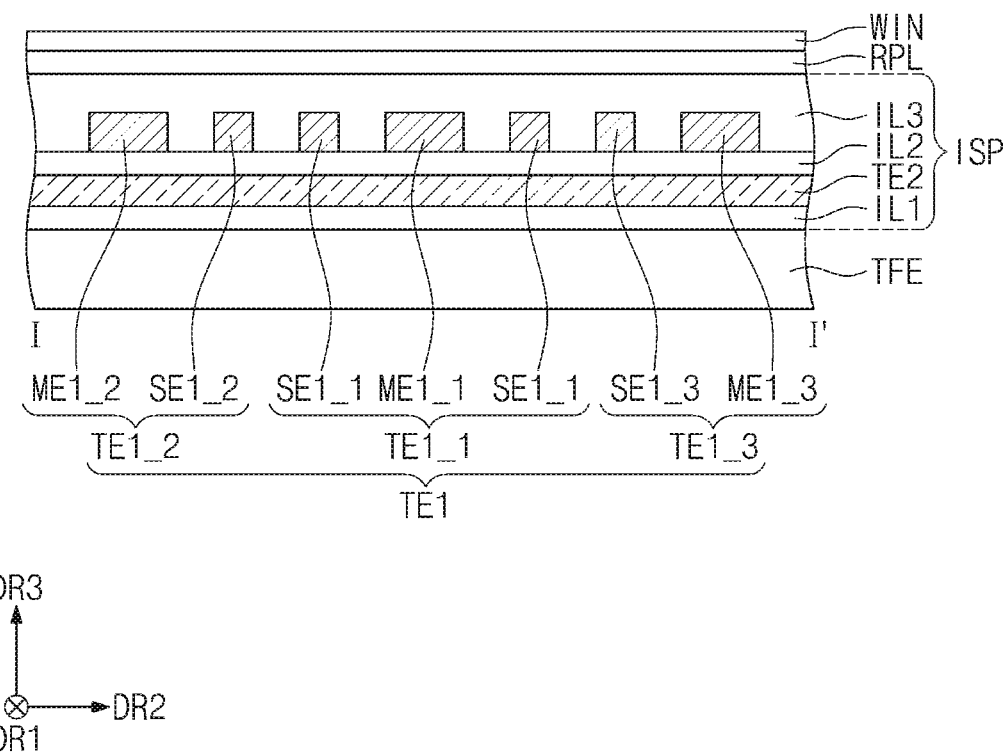
FIG. 8 is a cross-sectional view taken along a line I-I' shown in FIG. 7 according to an embodiment of the present inventive concept.

FIG. 8 is a cross-sectional view taken along a line I-I' of FIG. 7.

Referring to FIG. 8, the input sensing part ISP may be disposed between the thin film encapsulation layer TFE and the anti-reflective layer RPL. The input sensing part ISP may be disposed directly on the thin film encapsulation layer TFE. The expression that the input sensing part ISP is disposed directly on the thin film encapsulation layer means that no intervening elements are present between the input sensing part ISP and the thin film encapsulation layer. A separate adhesive member is not disposed between the input sensing part ISP and the thin film encapsulation layer. The present inventive concept is not limited thereto. In an embodiment, the input sensing part ISP may be combined with the thin film encapsulation layer TFE by using an adhesive member. The adhesive member may include an ordinary adhesive.

The input sensing part ISP may include the first sensing electrodes TE1, the second sensing electrodes TE2, a first sensing insulating layer ILL a second sensing insulating layer IL2, and a third sensing insulating layer IL3.

The first sensing insulating layer IL1 may be disposed on the thin film encapsulation layer TFE. The first sensing insulating layer IL1 may be an inorganic layer including at least one of silicon nitride, silicon oxynitride, and silicon oxide. The present inventive concept is not limited thereto. In an embodiment, the first sensing insulating layer IL1 may be an organic layer including an epoxy-based resin, an acrylic-based resin, or an imide-based resin.

The second sensing electrodes TE2 may be disposed on the first sensing insulating layer IL1. The second sensing insulating layer IL2 may be disposed on the second sensing electrodes TE2. The first sensing electrodes TE1 may be disposed on the second sensing insulating layer IL2. The third sensing insulating layer IL3 may be disposed on the first sensing electrodes TE1. The third sensing insulating layer IL3 may cover the first sensing electrodes TE1.

At least one of the second sensing insulating layer IL2 and the third sensing insulating layer IL3 may include an inorganic layer. The inorganic layer may include or may be formed of at least one of aluminum oxide, titanium oxide, silicon oxide, silicon nitride, silicon oxynitride, zirconium oxide, and hafnium oxide.

At least one of the second sensing insulating layer IL2 and the third sensing insulating layer IL3 may include or may be formed of an organic layer. The organic layer may include at least one of acrylic resin, methacrylic resin, polyisoprene, vinyl resin, epoxy resin, urethane resin, cellulose resin, siloxane resin, polyimide resin, polyamide resin, and perylene resin.

Figure 9:
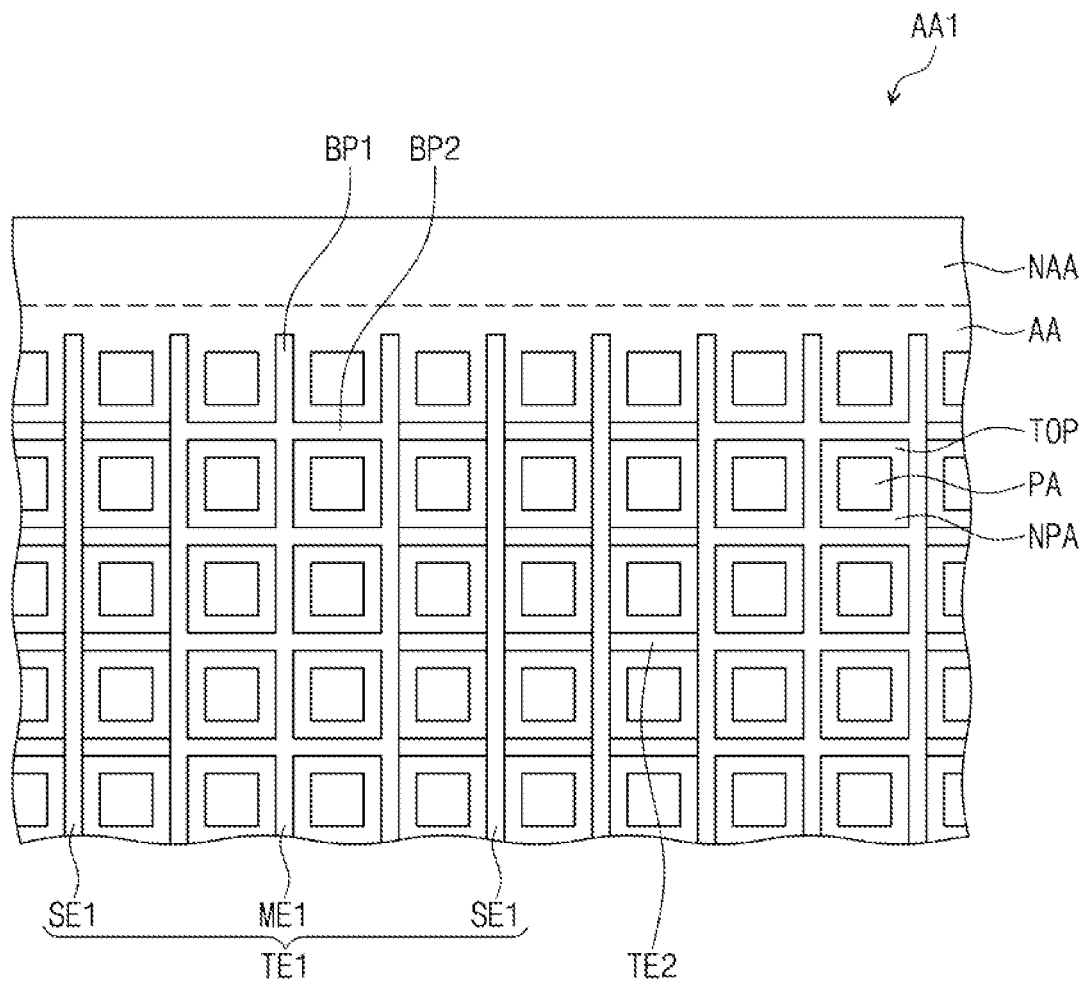
FIG. 9 is an enlarged view showing a portion AA1 shown in FIG. 7 according to an embodiment of the present inventive concept.

FIG. 9 is an enlarged view showing a portion AA1 shown in FIG. 7.

Referring to FIG. 9, each of the first and second sensing electrodes TE1 and TE2 may include a plurality of first branches BP1 extending lengthwise in the first direction DR1 and a plurality of second branches BP2 extending lengthwise in the second direction DR2. The first branches BP1 and the second branches BP2 may be connected each other to form a mesh shape.

The first main electrodes ME1 may include the first and second branches BP1 and BP2 to have the mesh shape. The first sub-electrodes SE1 may be formed by the first branches BP1 extending in the first direction DR1. However, the present inventive concept is not limited thereto. In an embodiment, the first sub-electrodes SE1 may have a mesh structure similar to that of the first main electrodes ME1.

The second main electrodes ME2 and the second sub-electrodes SE2 may have substantially the same shapes as those of the first main electrodes ME1 and the first sub-electrodes SE1 except that a direction in which the second main electrodes ME2 and the second sub-electrodes SE2 extend is different from that of the first main electrodes ME1 and the first sub-electrodes SE1.

Touch openings TOP, each having a quadrangular shape, may be defined by the first branches BP1 and the second branches BP2. The first and second branches BP1 and BP2 may overlap the non-light-emitting area NPA between the light emitting areas PA.

The light emitting area PA shown in FIG. 6 may be one of the light emitting areas PA shown in FIG. 9. The light emitting areas PA may be arranged in the first direction DR1 and the second direction DR2. Each light emitting area PA may have the quadrangular shape. The touch openings TOP may overlap the light emitting areas PA. The touch openings TOP may have the quadrangular shape corresponding to the shape of the light emitting areas PA. For example, each of the light emitting areas PA is disposed in a corresponding touch opening TOP.

Since the first and second sensing electrodes TE1 and TE2 are disposed in the non-light-emitting area NPA, a light generated by the light emitting areas PA may be normally emitted without being influenced by the first and second sensing electrodes TE1 and TE2.

Although not shown in figures, the light emitting areas PA may include a plurality of light emitting areas displaying a red color, a plurality of light emitting areas displaying a green color, and a plurality of light emitting areas displaying a blue color.

Figure 10:
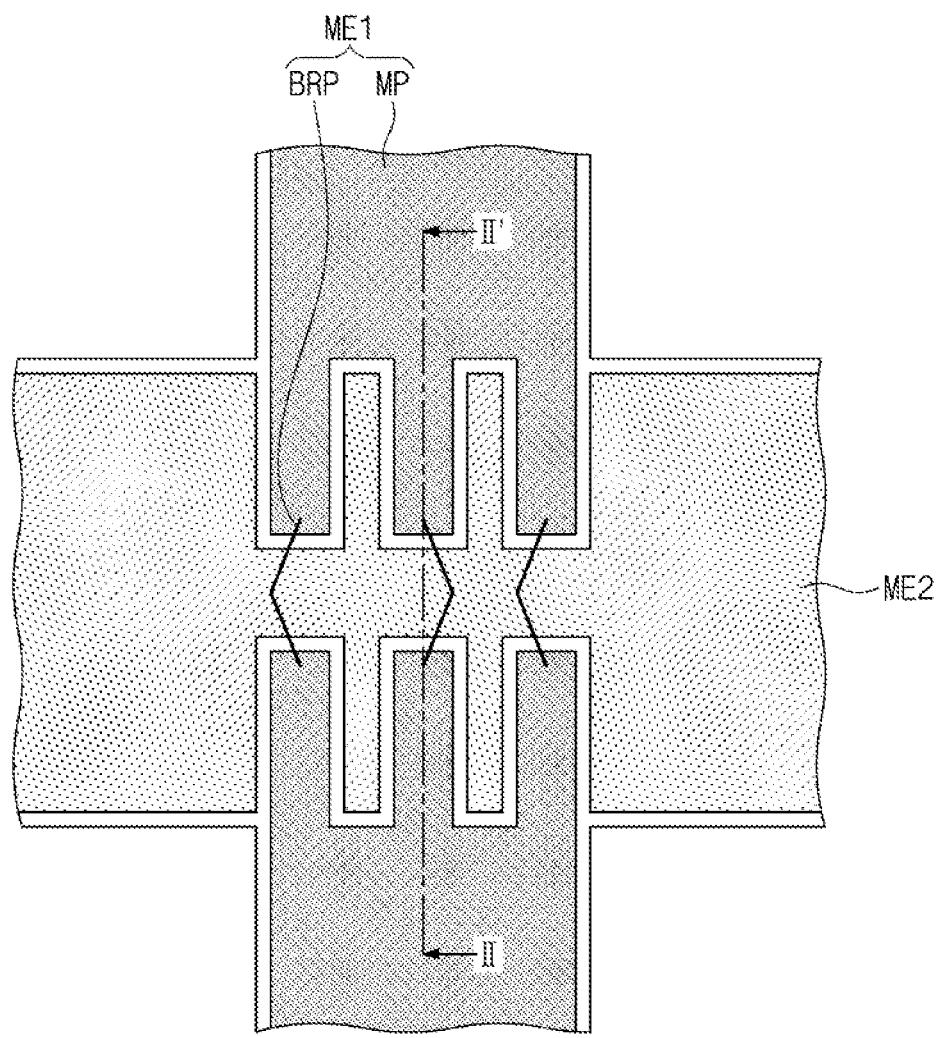
FIG. 10 is a view showing a structure in which one first main electrode and one second main electrode are disposed on the same layer according to an embodiment of the present inventive concept.

FIG. 10 is a view showing a structure in which one first main electrode and one second main electrode are disposed in the same layer.

Referring to FIG. 10 a portion of the first main electrode ME1 and a portion of the second main electrode ME2 may be adjacent to each other in a direction in which they cross each other.

The first main electrode ME1 may include mesh patterns MP and bridge patterns BRP electrically connected to the mesh patterns MP. The mesh patterns MP may be spaced apart from each other in the first direction DR1 with the second main electrode ME2 interposed therebetween. The bridge patterns BRP may overlap the second main electrode ME2, and the bridge patterns BRP may be insulated from the second main electrode ME2 while overlapping the second main electrode ME2. Although not shown in figures, the mesh patterns MP may have the mesh shape shown in FIG. 9.

The mesh patterns MP and the second main electrode ME2 may be disposed in the same layer as each other, and the bridge patterns BRP may be disposed in a layer different from the layer in which the mesh patterns MP and the second main electrode ME2 are disposed. For example, an insulating layer (not shown) may be interposed between a layer having the bridge patterns BRP and a layer having the mesh patterns MP and the second main electrode ME2. For example, the bridge patterns BRP are disposed on a bottom surface of the insulating layer, and the mesh patterns MP and the second main electrode ME2 are disposed on a top surface of the insulating layer. This structure may be called a bottom bridge structure. The present inventive concept, however, is not limited thereto. In an embodiment, the bridge patterns BRP may be disposed on a top surface of the insulating layer (not shown), and the mesh patterns MP and the second main electrode ME2 may be disposed on a bottom surface. This structure may be called a top bridge structure. Although not shown in figures, the first sub-electrodes SE1 and the second sub-electrodes SE2 overlapping the first sub-electrodes SE1 may have a similar structure as the first and second main electrodes ME1 and ME2.

Figure 11:
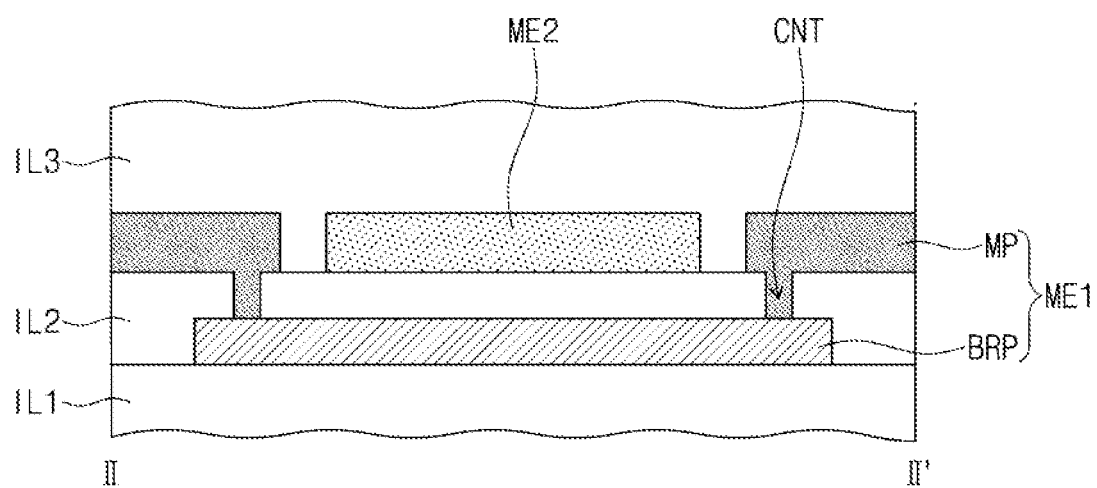
FIG. 11 is a cross-sectional view taken along a line II-IF shown in FIG. 7 according to an embodiment of the present inventive concept.
Figure 11:
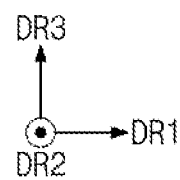

FIG. 11 is a cross-sectional view taken along a line II-IF shown in FIG. 10.

Referring to FIG. 11, the bridge pattern BRP may be a layer different from a layer of the second main electrode ME2 and the mesh patterns MP. FIG. 11 shows the bottom bridge structure as a representative example.

The bridge pattern BRP may be disposed on the first sensing insulating layer ILL The second sensing insulating layer IL2 may be disposed on the bridge pattern BRP. The second sensing insulating layer IL2 may cover the bridge pattern BRP.

The mesh patterns MP and the second main electrode ME2 may be disposed on the second sensing insulating layer IL2.

A plurality of contact holes CNT may be defined through the second sensing insulating layer IL2 in the third direction DR3. The mesh patterns MP adjacent to each other among the mesh patterns MP may be electrically connected to the bridge pattern BRP through the contact holes CNT.

The third sensing insulating layer IL3 may be disposed on the mesh patterns MP and the second main electrode ME2. The third sensing insulating layer IL3 may cover the mesh patterns MP and the second main electrode ME2.

Figure 12:
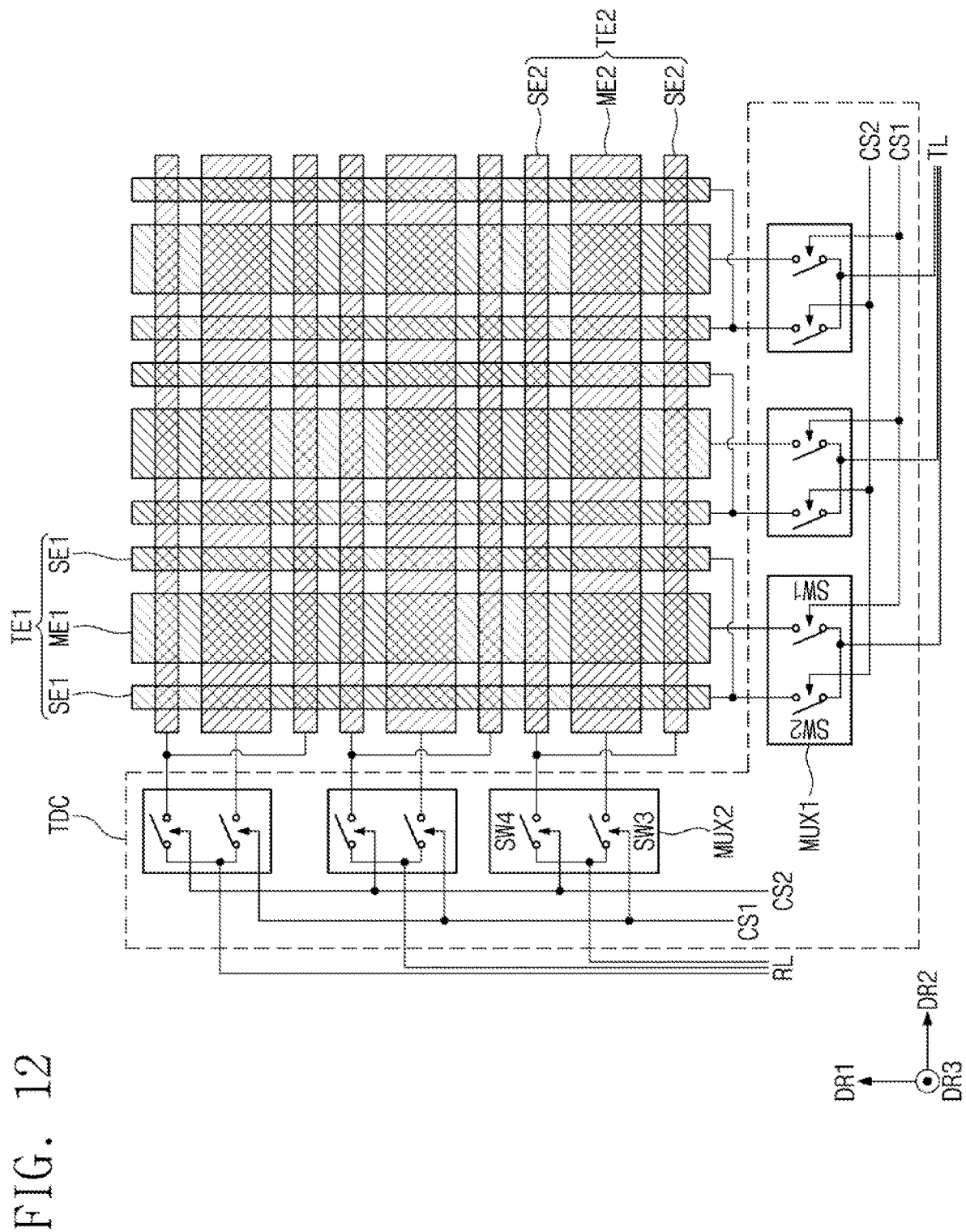
FIG. 12 is a view showing a connection relation between first and second sensing electrodes of an input sensing part and first and second group of switches circuits according to an embodiment of the present inventive concept.

FIG. 12 is a view showing a connection relation between the first and second sensing electrodes of the input sensing part and the first and second group of switches.

For the convenience of explanation, the second and third pads PD2 and PD3 that connect the first and second sensing electrodes TE1 and TE2 to first and second group of switches MUX1 and MUX2 are omitted in FIG. 12.

Referring to FIG. 12, the display device DD may include the touch driving controller TDC. The touch driving controller TDC may include the first group of switches MUX1 and the second group of switches MUX2. Transmission lines TL may be connected to the first group of switches MUX1, respectively. Receiving lines RL may be connected to the second group of switches MUX2, respectively.

The first group of switches MUX1 may include a plurality of first switches SW1 and a plurality of second switches SW2. The second group of switches MUX2 may include a plurality of third switches SW3 and a plurality of fourth switches SW4.

Each of the first group of switches MUX1 may include a pair of first and second switches SW1 and SW2. Each of the second group of switches MUX2 may include a pair of third and fourth switches SW3 and SW4.

Each of the transmission lines TL may be connected to the first switch SW1 and the second switch SW2 of a corresponding first group of switches MUX1 among the first group of switches MUX1. Each of the receiving lines RL may be connected to the third switch SW3 and the fourth switch SW4 of a corresponding second group of switches MUX2 among the second group of switches MUX2.

The first switches SW1 may be connected to the first main electrodes ME1. The second switches SW2 may be connected to the first sub-electrodes SE1. The third switches SW3 may be connected to the second main electrodes ME2. The fourth switches SW4 may be connected to the second sub-electrodes SE2.

The first control signal CS1 and the second control signal CS2 may control switching operations of the first and second switches SW1 and SW2 and switching operations of the third and fourth switches SW3 and SW4. For example, the first control signal CS1 and the second control signal CS2 may turn on and turn off the first and second switches SW1 and SW2 and the third and fourth switches SW3 and SW4. After the first control signal CS1 is applied, the second control signal CS2 may be applied. After the second control signal CS2 is applied, the first control signal CS1 may be applied.

The first switches SW1 of the first group of switches MUX1 may be turned on in response to the first control signal CS1. The transmission lines TL may be, in response to the first control signal CS1, connected to the first main electrodes ME1 through the first switches SW1 of the first group of switches MUX1.

The second switches SW2 of the first group of switches MUX1 may be turned on in response to the second control signal CS2. The transmission lines TL may be, in response to the second control signal CS2, connected to the first sub-electrodes SE1 through the second switches SW2 of the first group of switches MUX1.

The third switches SW3 of the second group of switches MUX2 may be turned on in response to the first control signal CS1. In an embodiment, the third switches SW3 may be turned on together with the first switches SW1. The receiving lines RL may be, in response to the first control signal CS1, connected to the second main electrodes ME2 through the third switches SW3 of the second group of switches MUX2.

The fourth switches SW4 of the second group of switches MUX2 may be turned on in response to the second control signal CS2. In an embodiment, the fourth switches SW4 may be turned on together with the second switches SW2. The receiving lines RL may be, in response to the second control signal CS2, connected to the second sub-electrodes SE2 through the fourth switches SW4 of the second group of switches MUX2.

When the first and third switches SW1 and SW3 are turned on, the second and fourth switches SW2 and SW4 are turned off. When the second and fourth switches SW2 and SW4 are turned on, the first and third switches SW1 and SW3 may be turned off.

Figure 13A:
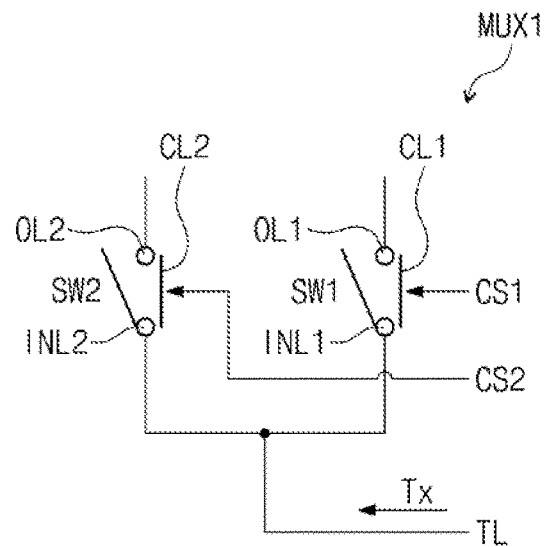
FIGS. 13A and 13B are circuit diagrams showing one first group of switches circuit and one second group of switches circuit among the first and second group of switches circuits shown in FIG. 12, respectively, according to an embodiment of the present inventive concept.
Figure 13B:
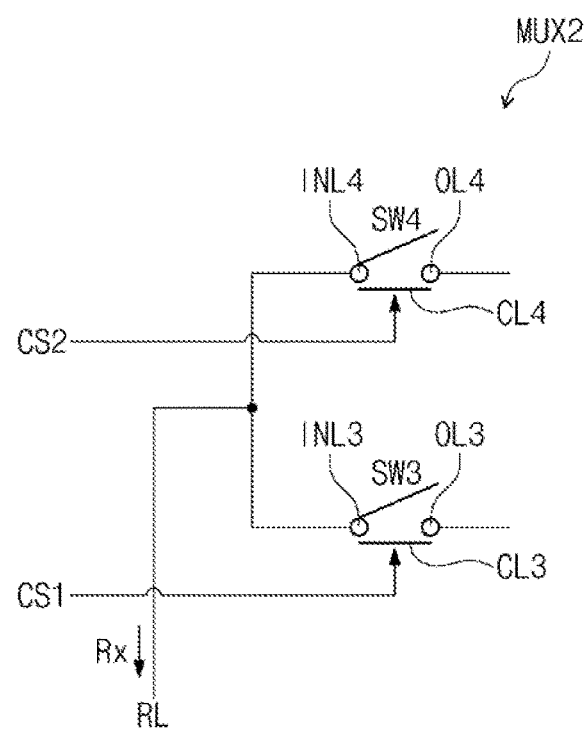

FIGS. 13A and 13B are circuit diagrams showing one first group of switches MUX1 and one second group of switches MUX2 among the first and second group of switches shown in FIG. 12, respectively.

Referring to FIGS. 13A and 13B, the first group of switches MUX1 may include the first switch SW1 and the second switch SW2. As an example, each of the first switch SW1 and the second switch SW2 may be a transistor.

The first switch SW1 may include a first input terminal INL1 connected to a corresponding transmission line among the transmission lines TL, a first output terminal OL1 connected to a corresponding first main electrode ME1 among the first main electrodes ME1, and a first control terminal CL1 receiving the first control signal CS1. In an embodiment, the first input terminal INL1 and the first output terminal OL1 may be a source and a drain of the transistor, respectively, and the first control terminal CL1 may be a gate of the transistor.

The second switch SW2 may include a second input terminal INL2 connected to a corresponding transmission line among the transmission lines TL, a second output terminal OL2 connected to a corresponding first sub-electrodes SE1 among the first sub-electrodes SE1, and a second control terminal CL2 receiving the second control signal CS2. In an embodiment, the second input terminal INL2 and the second output terminal OL2 may be a source and a drain of the transistor, respectively, and the second control terminal CL2 may be a gate of the transistor. The first group of switches MUX1 may selectively connect the transmission line TL to one of the first main electrode ME1 and the first sub-electrodes SE1.

The second group of switches MUX2 may include the third switch SW3 and the fourth switch SW4. In an embodiment, each of the third switch SW3 and the fourth switch SW4 may be a transistor.

The third switch SW3 may include a third input terminal INL3 connected to a corresponding receiving line among the receiving lines RL, a third output terminal OL3 connected to a corresponding second main electrode ME2 among the second main electrodes ME2, and a third control terminal CL3 receiving the first control signal CS1. In an embodiment, the third input terminal INL3 and the third output terminal OL3 may be a source and a drain of the transistor, and the third control terminal CL3 may be a gate of the transistor.

The fourth switch SW4 may include a fourth input terminal INL4 connected to a corresponding receiving line among the receiving lines RL, a fourth output terminal OL4 connected to a corresponding second sub-electrodes SE2 among the second sub-electrodes SE2, and a fourth control terminal CL4 receiving the second control signal CS2. In an embodiment, the fourth input terminal INL4 and the fourth output terminal OL4 may be a source and a drain of the transistor, respectively, and the fourth control terminal CL4 may be a gate of the transistor.

The second group of switches MUX2 may selectively connect the receiving line RL to one of the second main electrode ME2 and the second sub-electrodes SE2.

Figure 14A:
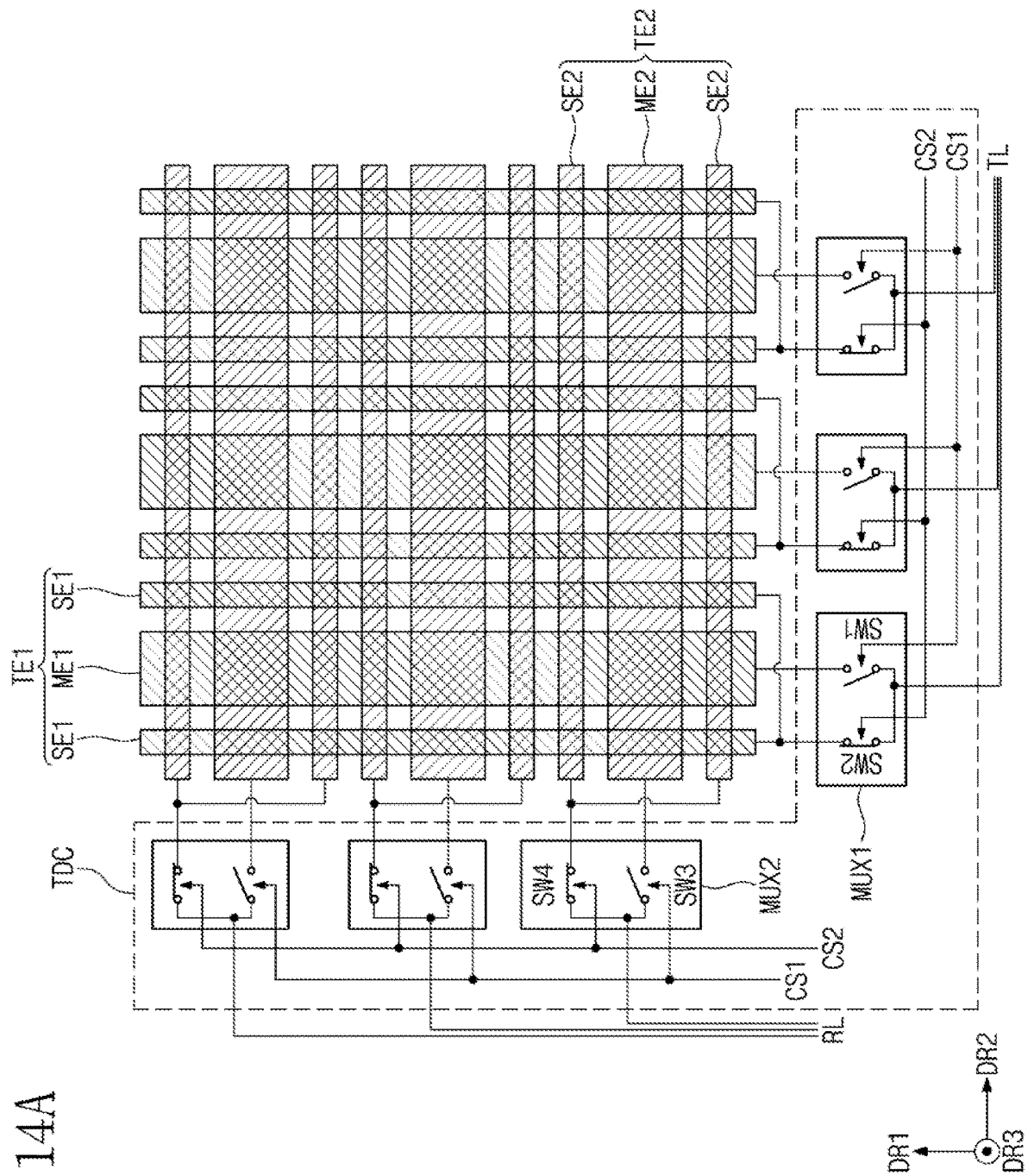
FIG. 14A is a view showing an uplink operation between a display device and a touch pen according to an embodiment of the inventive concept.

FIG. 14A is a view showing an uplink operation between a display device and a touch pen according to an exemplary embodiment of the present disclosure.

Referring to FIG. 14A, the touch pen may approach the display panel. The touch pen (e.g., an active pen) may be an active type of an input member that provides a driving signal. Accordingly, the touch pen may be referred to as the active pen, the input member, or the input unit. The first and second sensing electrodes TE1 and TE2 may be used as a transmission electrode to provide an uplink signal provided from the touch driving controller to the touch pen. For example, the uplink signal may include panel information, information on protocol version, or the like. The present inventive concept, however, is not limited thereto.

FIG. 14A shows an example in which both the first sub-electrodes SE1 and the second sub-electrodes SE2 are used as the transmission electrode. The present inventive concept, however, is not limited thereto. For example, the first sub-electrodes SE1 may be used as the transmission electrode, or the second sub-electrodes SE2 may be used as the transmission electrode.

In response to the touch pen approaching the display panel, the touch driving controller TDC may generate the uplink signal, the first control signal CS1, and the second control signal CS2. The uplink signal is transmitted from the touch driving controller TDC to the transmission line TL. The first control signal CS1 may turn off the first switches SW1. The second control signal CS2 may turn on the second switches SW2. The first control signal CS1 may turn off the third switches SW3. The second control signal CS2 may turn on the fourth switches SW4.

The transmission lines TL may be connected to the first sub-electrodes SE1 through the second switches SW2. The receiving lines RL may be connected to the second sub-electrodes SE2 through the fourth switches SW4. Accordingly, the uplink signals transmitted through the transmission lines TL and the receiving lines RL may be provided to the first sub-electrodes SE1 and the second sub-electrodes SE2 through the second switches SW2 and the fourth switches SW4.

The uplink signals may be transmitted to the touch pen PN through the first sub-electrodes SE1 and the second sub-electrodes SE2.

The uplink signal may be transmitted to the touch pen PN through the first sub-electrodes SE1 and the second sub-electrodes SE2, which have an area smaller than that of the first main electrodes ME1 and the second main electrodes ME2. The uplink signal ULS may affect the display panel DP, and thus, a noise may occur in the display panel DP. The noise may be proportional to an area of an electrode through which the uplink signal ULS is transmitted.

Since the uplink signal is transmitted through a small area, the noise occurring in the display panel DP may be reduced compared to when the uplink signal is transmitted to the display panel DP through the first and second main electrodes ME1 and ME2.

Figure 14B:
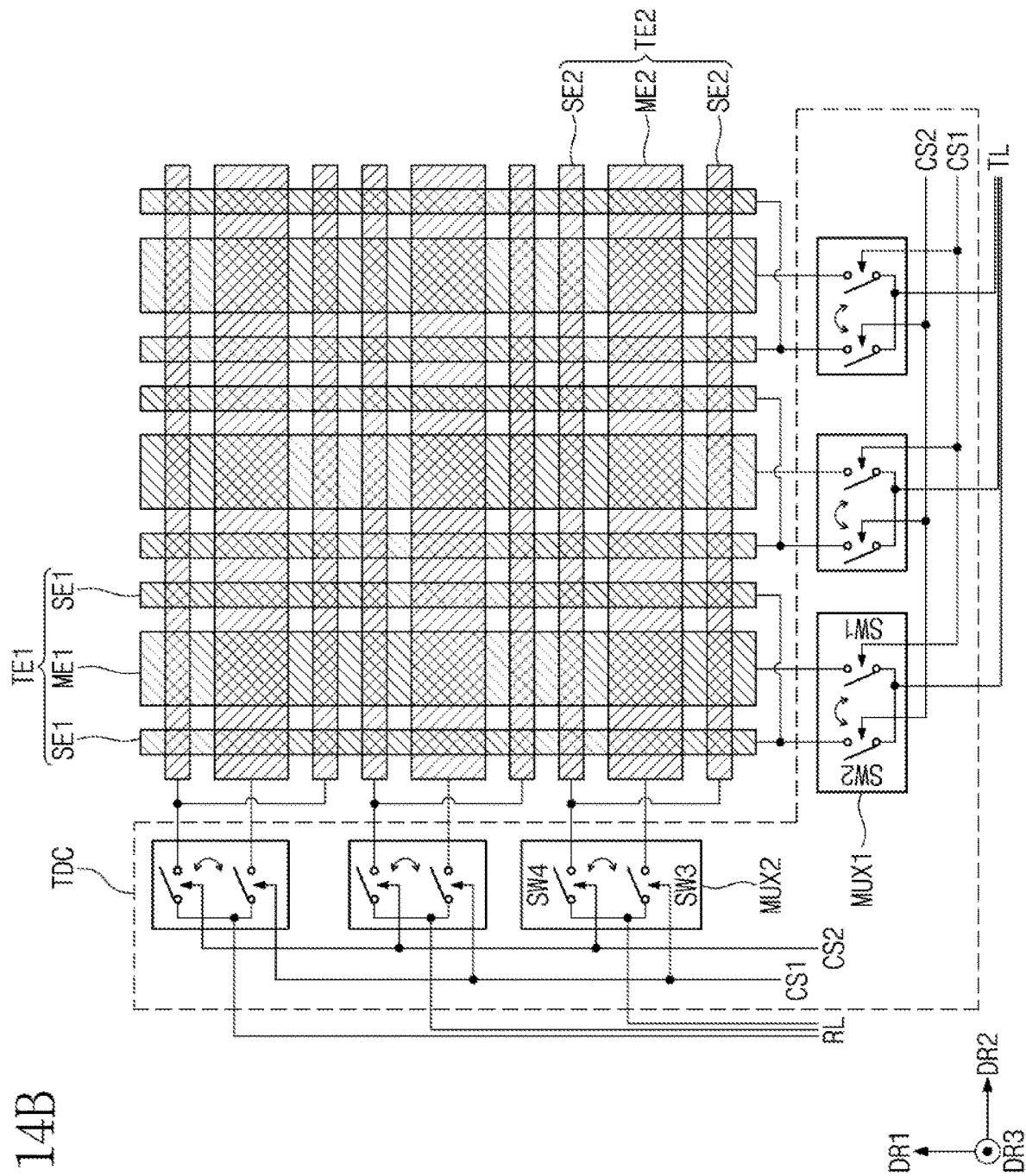
FIG. 14B is a view showing a downlink operation between a display device and a touch pen according to an embodiment of the inventive concept.

FIG. 14B is a view showing a downlink operation between a display device and a touch pen according to an exemplary embodiment of the present disclosure.

Referring to FIG. 14B, the first and second sensing electrodes TE1 and TE2 may be operated in a first mode and a second mode. An operation to sense an input by the touch pen PN may be operated in the first mode. An operation to sense an input by the user's hand may be operated in the second mode.

The first mode may be a mode in which the display device DD and the touch pen PN transmit and receive data to and from each other. In the first mode, each of the first sub-electrodes SE1 and the second sub-electrodes SE2 may be used as the transmission electrode to provide the uplink signal provided from the touch sensing driver to the touch pen PN. The uplink operation has been previously described in FIG. 13A, so details thereof will be omitted.

When the touch pen PN touches the display panel DP after the uplink operation is completed, each of the first sensing electrodes TE1 and the second sensing electrodes TE2 may be used as a receiving electrode to transmit a sensing signal induced from the touch pen PN to a touch sensing driver. For example, the touch pen PN may transmit a downlink signal to the display device DD.

In response to the touch pen PN which touches the display panel DP, the touch driving controller TDC may generate the first and second control signals CS1 and CS2. The first switches SW1 of the first group of switches MUX1 and the third switches SW3 of the second group of switches MUX2 may be turned on in response to the first control signal CS1. The transmission lines TL may be used as the receiving lines. The receiving lines RL may be connected to the second main electrodes ME2 through the second group of switches MUX2. The downlink signal may be received by the first and second main electrodes ME1 and ME2.

After the first control signal CS1 is applied, the second control signal CS2 may be applied. The second switches SW2 of the first group of switches MUX1 may be turned on in response to the second control signal CS2. The transmission lines TL may be connected to the first sub-electrodes SE1 through the first group of switches MUX1. The transmission lines TL may be used as the receiving lines. The receiving lines RL may be connected to the second sub-electrodes SE2 through the second group of switches MUX2. The downlink signal may be received by the first and second sub-electrodes SE1 and SE2.

In the second mode, the external input may be sensed by detecting a variation in mutual capacitance between the first sensing electrodes TE1 and the second sensing electrodes TE2.

In response to the finger which touches the display panel DP, the touch driving controller TDC may generate the first and second control signals CS1 and CS2. The first switches SW1 of the first group of switches MUX1 may be turned on in response to the first control signal CS1. For example, the first switches SW1 may be turned on by the first control signal CS1, and the transmission lines TL may be connected to the first main electrodes ME1. The first main electrodes ME1 may serve as the transmission electrode.

The third switches SW3 of the second group of switches MUX2 may be turned on in response to the first control signal CS1. For example, the third switches SW3 may be turned on by the first control signal CS1, and the receiving lines RL may be connected to the second main electrodes ME2. The second main electrodes ME2 may serve as the receiving electrode. The present inventive concept, however, is not limited thereto. In an embodiment, the first main electrodes ME1 may serve as the receiving electrode, and the second main electrodes ME2 may serve as the transmission electrode.

The driving signal may be applied to the first main electrodes ME1 through the transmission lines TL, and the sensing signals may be output to the receiving lines RL through the second main electrodes ME2.

After the first control signal CS1 is applied, the second control signal CS2 may be applied. The second switches SW2 of the first group of switches MUX1 may be turned on in response to the second control signal CS2. The first sub-electrodes SE1 may serve as the transmission electrode. The fourth switches SW4 of the second group of switches MUX2 may be turned on in response to the second control signal CS2. The second sub-electrodes SE2 may serve as the receiving electrode, however, they should not be limited thereto or thereby. For example, the first sub-electrodes SE1 may serve as the receiving electrode, and the second sub-electrodes SE2 may serve as the transmission electrode.

Figure 15:
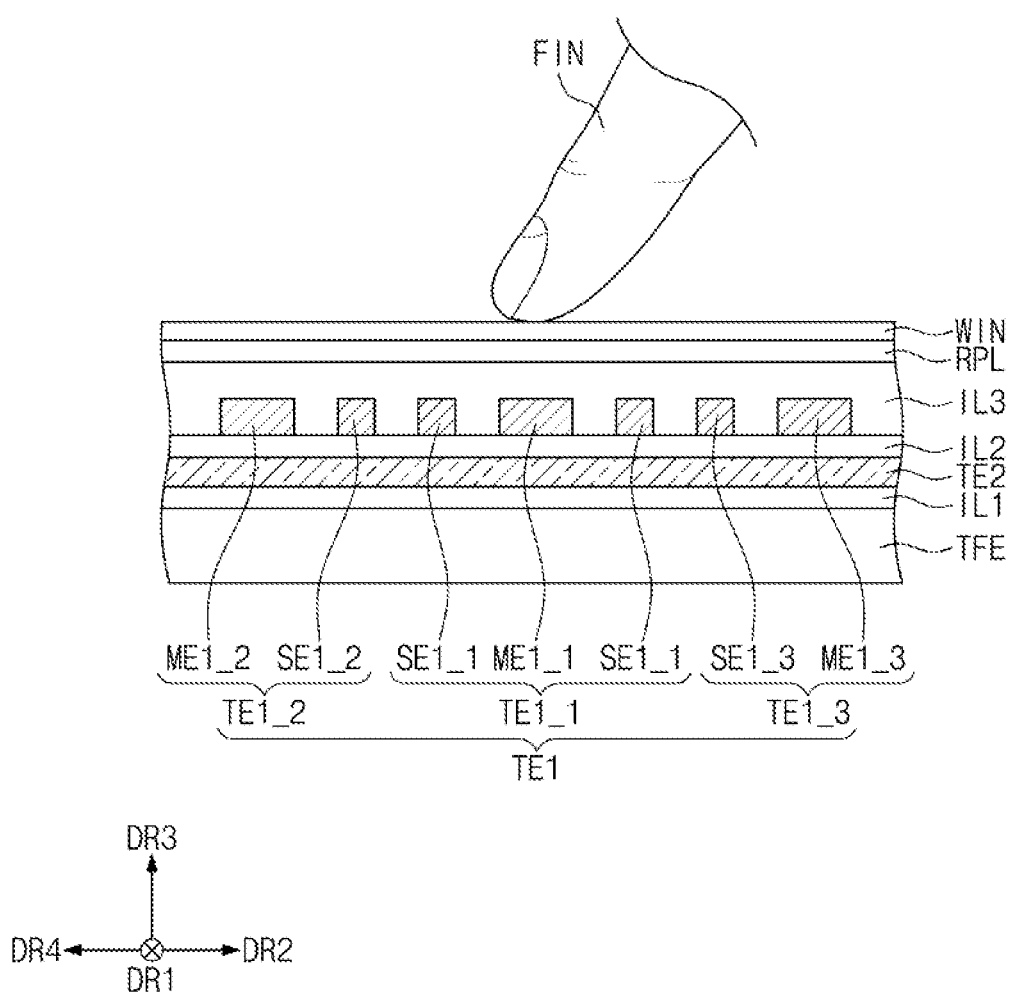
FIGS. 15 and 16 are cross-sectional views taken along a line I-I' of FIG. 7 to show a finger and a touch pen that are in contact with a portion of a display device according to an embodiment of the inventive concept.
Figure 16:
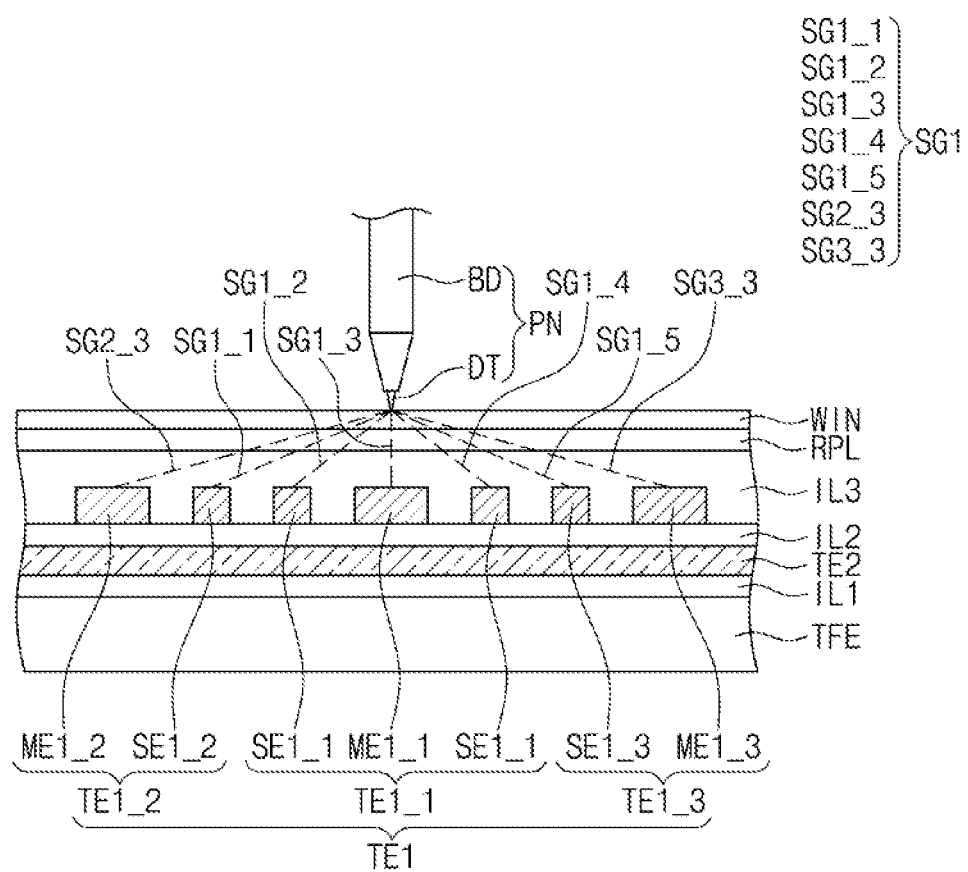
Figure 17:
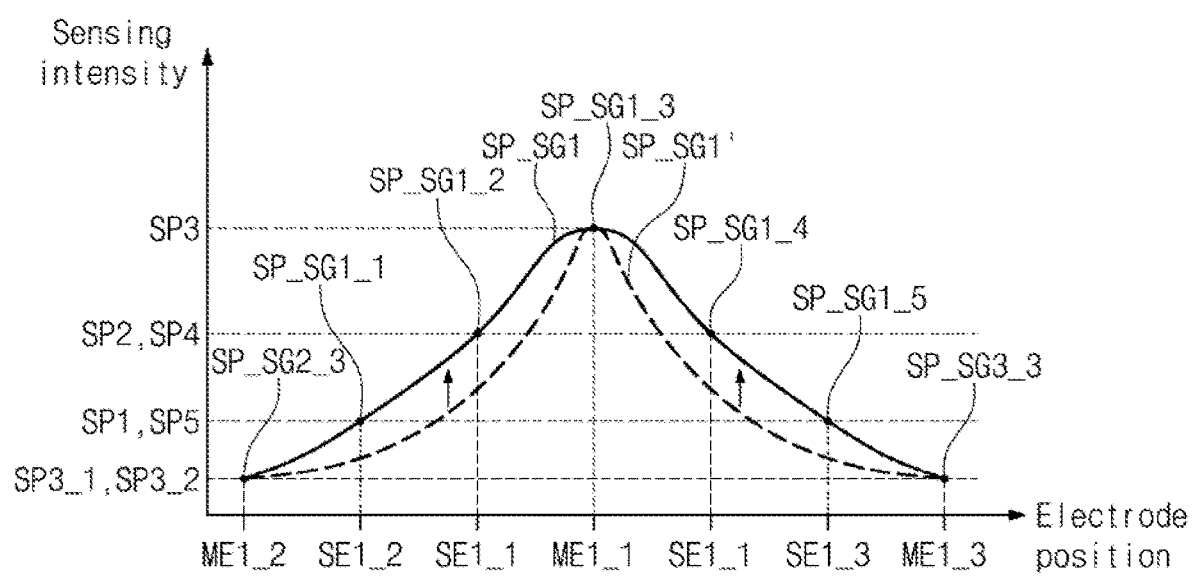
FIG. 17 is a graph showing a signal of an input sensor receiving a first signal according to an embodiment of the inventive concept.

FIGS. 15 and 16 are cross-sectional views taken along a line I-I' of FIG. 7 to show a finger FIN and a touch pen PN that are in contact with a portion of the display device according to an exemplary embodiment of the present disclosure. In FIGS. 15 and 16, the same reference numerals denote the same elements in FIGS. 3 and 7, and thus, detailed descriptions of the same elements will be omitted. FIG. 17 is a graph showing a signal of the input sensor receiving the first signal according to an exemplary embodiment of the present disclosure.

Referring to FIG. 15, the finger FIN may be disposed on the window WIN.

When the finger FIN touches the window WIN, the touch sensing driver may operate in the second mode. The first sensing electrodes TE1 may transmit the driving signal, and the second sensing electrodes TE2 may receive the sensing signal. In the second mode, the touch sensing driver may sense the input by the finger FIN by detecting the variation in mutual capacitance between the first sensing electrodes TE1 and the second sensing electrodes TE2. The present inventive concept, however, is not limited thereto. For example, the second sensing electrodes TE2 may serve as the transmission electrode, and the first sensing electrodes TE1 may serve as the receiving electrode.

Referring to FIGS. 16 and 17, the touch pen PN may be disposed on the window WIN and may transmit a first signal SG1.

A sensing portion DT may be disposed at an end of the touch pen PN. The sensing portion DT may be connected to a body portion BD to form the touch pen PN.

A first_second sensing electrode TE1_2 and a first_third sensing electrode TE1_3 may be spaced apart from each other in the second direction DR2 with a first_first sensing electrode TE1_1 interposed therebetween. The first_second sensing electrode TE1_2 may include a first_second main electrode ME1_2 and a first_second sub-electrode SE1_2. The first_third sensing electrode TE1_3 may include a first_third main electrode ME1_3 and a first_third sub-electrode SE1_3.

The sensing portion DT of the touch pen PN may transmit the first signal SG1. The first signal SG1 may form an electric field. The touch sensing driver may calculate the sensing signal with the shape of a Gaussian distribution from the first_first, first_second, and first_third sensing electrodes TE1_1, TE1_2, and TE1_3 that sense the electric field.

The first signal SG1 may include a first sub-signal SG1_1, a second sub-signal SG1_2, a third sub-signal SG1_3, a fourth sub-signal SG1_4, a fifth sub-signal SG1_5, a sixth sub-signal SG2_3, and a seventh sub-signal SG3_3. The first sub-signal SG1_1, the second sub-signal SG1_2, the third sub-signal SG1_3, the fourth sub-signal SG1_4, the fifth sub-signal SG1_5, the sixth sub-signal SG2_3, and the seventh sub-signal SG3_3 are classified according to an angle at which the first signal SG1 is emitted.

The first_second sub-electrode SE1_2 may sense the first sub-signal SG1_1, and the touch sensing driver may calculate a first sensing signal SP_SG1_1 of the first sensing intensity SP1 at a position of the first_second sub-electrode SE1_2.

The first_first sub-electrode SE1_1 may sense the second sub-signal SG1_2, and the touch sensing driver may calculate a second sensing signal SP_SG1_2 of the second sensing intensity SP2 at a position of the first_first sub-electrode SE1_1.

The first_first main electrode ME1_1 may sense the third sub-signal SG1_3, and the touch sensing driver may calculate a third sensing signal SP_SG1_3 of the third sensing intensity SP3 at a position of the first_first main electrode ME1_1.

The first_first sub-electrode SE1_1 may sense the fourth sub-signal SG1_4, and the touch sensing driver may calculate a fourth sensing signal SP_SG1_4 of the fourth sensing intensity SP4 at a position of the first_first sub-electrode SE1_1.

The first_third sub-electrode SE1_3 may sense the fifth sub-signal SG1_5, and the touch sensing driver may calculate a fifth sensing signal SP_SG1_5 of the fifth sensing intensity SP5 at a position of the first_third sub-electrode SE1_3.

The first_second main electrode ME1_2 may sense the sixth sub-signal SG2_3, and the touch sensing driver may calculate a sixth sensing signal SP_SG2_3 of the sixth sensing intensity SP3_1 at a position of the first_second main electrode ME1_2.

The first_third main electrode ME1_3 may sense the seventh sub-signal SG3_3, and the touch sensing driver may calculate a seventh sensing signal SP_SG3_3 of the seventh sensing intensity SP3_2 of the first_third main electrode ME1_3.

The touch sensing driver may combine the first sensing signal SP_SG1_1, the second sensing signal SP_SG1_2, the third sensing signal SP_SG1_3, the fourth sensing signal SP_SG1_4, the fifth sensing signal SP_SG1_5, the sixth sensing signal SP_SG2_3, and the seventh sensing signal SP_SG3_3 to form a first combination signal SP_SG1.

In a case where the sub-electrodes are not provided, the first_second main electrode ME1_2 may calculate the sixth sensing signal SP_SG2_3, the first_first main electrode ME1_1 may calculate the third sensing signal SP_SG1_3, and the first_third main electrode ME1_3 may calculate the seventh sensing signal SP_SG3_3. The touch sensing driver may combine the third sensing signal SP_SG1_3, the sixth sensing signal SP_SG2_3, and the seventh sensing signal SP_SG3_3 to form a second combination signal SP_SG'.

Referring to FIG. 17, the first combination signal SP_SG1 may have a sensing intensity with a gentler slope than the second combination signal SP_SG1'. The first combination signal SP_SG1 are obtained by combining more peripheral signals than the second combination signal SP_SG1', and thus, an accuracy of coordinates of a position at which the touch pen PN is disposed may be improved.

In FIG. 17, a first sensing intensity SP1 is the same as a fifth sensing intensity SP5, a second sensing intensity SP2 is the same as a fourth sensing intensity SP4, and a sixth sensing intensity SP3_1 is the same as a seventh sensing intensity SP3_2. However, depending on the position of the touch pen PN, the first sensing intensity SP1 may be recognized as being different from the fifth sensing intensity SP5, the second sensing intensity SP2 may be recognized as being different from the fourth sensing intensity SP4, and the sixth sensing intensity SP3_1 may be recognized as being different from the seventh sensing intensity SP3_2.

For example, when the first sensing intensity SP1 of the first sensing signal SP_SG1_1 is different from the fifth sensing intensity SP5 of the fifth sensing signal SP_SG1_5, the position of the touch pen PN may be accurately calculated by comparing the first sensing intensity SP1 with the fifth sensing intensity SP5. For example, when the first sensing intensity SP1 is greater than the fifth sensing intensity SP5, the touch sensing driver may calculate the position of the touch pen PN as coordinates moved from a center of the first_first main electrode ME1_1 to a fourth direction DR4 that is a direction opposite to the second direction DR2. When the second sensing intensity SP2 is smaller than the fourth sensing intensity SP4, the touch sensing driver may calculate the position of the touch pen PN as coordinates moved from the center of the first_first main electrode ME1_1 to the second direction DR2.

According to the present disclosure, each of the first_first sub-electrodes SE1_1 may be disposed between the first_first main electrode ME1_1 and the first_second sub-electrode SE1_2 and between the first_first main electrode ME1_1 and the first_third sub-electrode SE1_3. The first_second sub-electrode SE1_2 may be disposed between the first_first sub-electrode SE1_1 and the first_second main electrode ME1_2. The first_third sub-electrode SE1_3 may be disposed between the first_first sub-electrode SE1_1 and the first_third main electrode ME1_3. The first_second sub-electrode SE1_2, the first_first sub-electrodes SE1_1, and the first_third sub-electrode SE1_3 may sense the first signal SG1.

The touch sensing driver may correct the coordinates of the position of the touch pen PN using the first sensing signal SP_SG1_1, the second sensing signal SP_SG1_2, the fourth sensing signal SP_SG1_4, and the fifth sensing signal SP_SG1_5. The coordinate accuracy of the display device DD with respect to the first signal SG1 of the touch pen PN may be improved. Accordingly, a sensing reliability of the display device DD may be improved.

Figure 18:
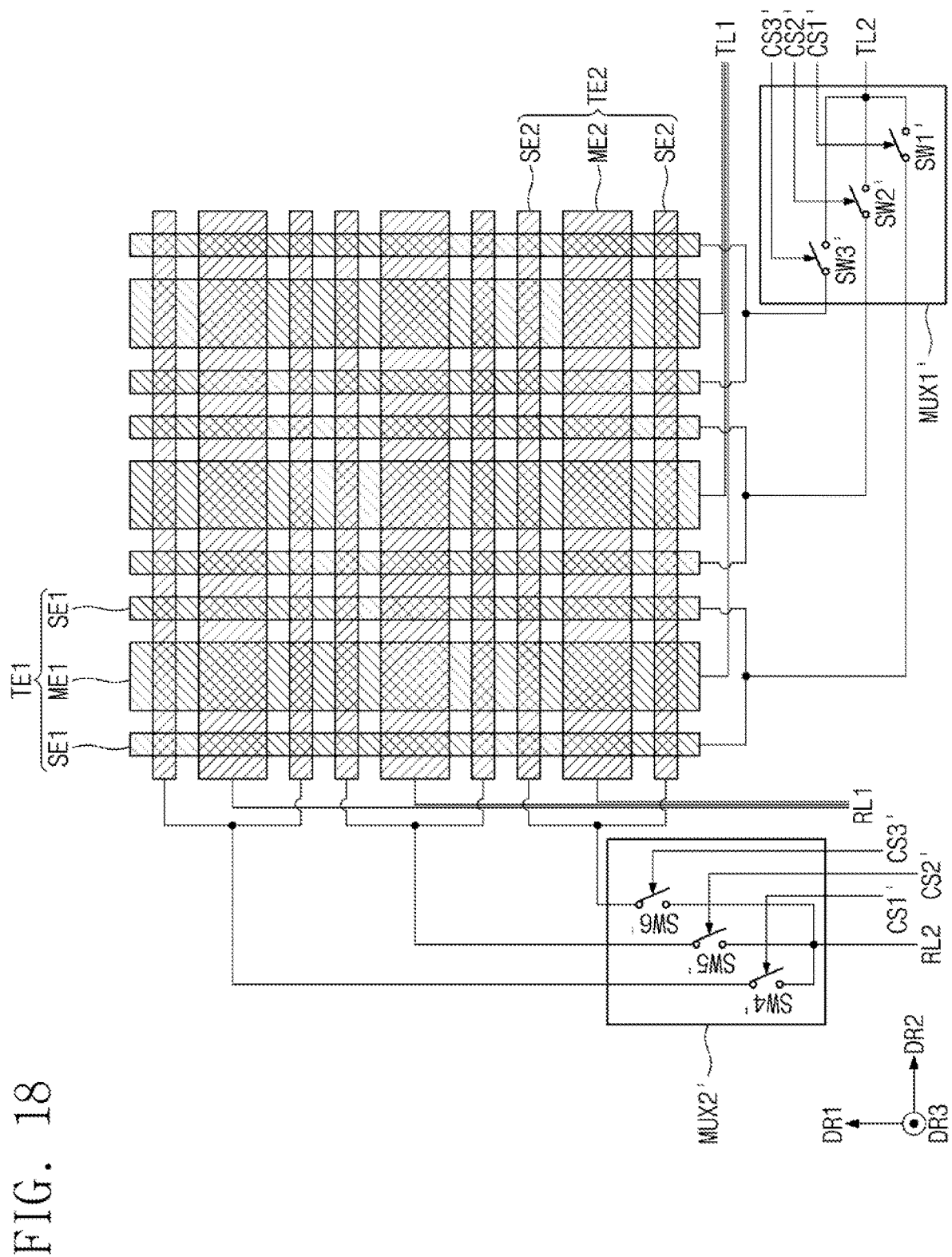
FIG. 18 is a view showing a connection relation between first and second sensing electrodes of an input sensing part and first and second group of switches circuits according to embodiment of the inventive concept.

FIG. 18 is a view showing a connection relation between first and second sensing electrodes of an input sensing part and first and second group of switches according to another exemplary embodiment of the present disclosure.

Hereinafter, a connection relation between first and second sensing electrodes TE1 and TE2 and first and second group of switches MUX1' and MUX2' of the of the input sensing part according to another exemplary embodiment of the present disclosure will be described with reference to FIG. 18. In FIG. 18, the same reference numerals denote the same elements in FIG. 12, and thus, detailed descriptions of the same elements will be omitted.

Referring to FIG. 18, first transmission lines TL1 may be respectively connected to first main electrodes ME1. Second transmission line TL2 may be selectively connected to first sub-electrodes SE1 through the first group of switches MUX1'.

First receiving lines RL1 may be respectively connected to second main electrodes ME2. Second receiving line RL2 may be selectively connected to second sub-electrodes SE2 through the second group of switches MUX2'.

The first group of switches MUX1' may include a first switch SW1', a second switch SW2', and a third switch SW3'. The second group of switches MUX2' may include a fourth switch SW4', a fifth switch SW5', and a sixth switch SW6'.

Driving signals may be sequentially provided to the first main electrodes ME1 through the first transmission lines TL1. Sensing signals may be sequentially output through the second main electrodes ME2 and the first receiving lines RL1.

The driving signals may be applied through the second transmission line TL2 after being applied through the first transmission lines TL1. The first switch SW1', the second switch SW2', and the third switch SW3' of the first group of switches MUX1' may be sequentially turned on in response to a first control signal CS1', a second control signal CS2', and a third control signal CS3'. The driving signals may be sequentially provided to the first sub-electrodes SE1 through the second transmission line TL2.

The fourth switch SW4', the fifth switch SW5', and the sixth switch SW6' of the second group of switches MUX2' may be sequentially turned on in response to the first control signal CS1', the second control signal CS2', and the third control signal CS3'. The sensing signals may be sequentially output through the second sub-electrodes SE2 and the second receiving line RL2.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A display device comprising:
a display panel; and
an input sensing part disposed on the display panel, the input sensing part comprising:
  a first main electrode extending lengthwise in a first direction;
  a first sub-electrode extending lengthwise in the first direction and being adjacent to the first main electrode;
  a second main electrode extending lengthwise in a second direction different from the first direction and insulated from the first main electrode and the first sub-electrode,
  wherein the second main electrode overlaps the first main electrode and the first sub-electrode;
  a second sub-electrode extending lengthwise in the second direction, disposed adjacent to the second main electrode, and insulated from the first main electrode and the first sub-electrode,
  wherein the second sub-electrode overlaps the first main electrode and the first sub-electrode;
  a first group of switches configured to selectively connect a transmission line and one of the first main electrode and the first sub-electrode with each other; and
  a second group of switches configured to selectively connect a receiving line and one of the second main electrode and the second sub-electrode with each other.

2. The display device of claim 1,
wherein the first group of switches is configured to connect, in response to a first control signal, the transmission line and the first main electrode with each other.

3. The display device of claim 2,
wherein the first group of switches is configured to connect, in response to a second control signal applied at a different timing from the first control signal, the transmission line and the first sub-electrode with each other.

4. The display device of claim 1,
wherein the second group of switches is configured to connect, in response to a first control signal, the receiving line and the second main electrode with each other.

5. The display device of claim 4,
wherein the second group of switches is configured to connect, in response to a second control signal applied at a different timing from the first control signal, the receiving line and the second sub-electrode with each other.

6. The display device of claim 1,
wherein the first group of switches comprises:
a first switch comprising a first input terminal connected to the transmission line, a first output terminal connected to the first main electrode, and a first control terminal receiving a first control signal; and
a second switch comprising a second input terminal connected to the transmission line, a second output terminal connected to the first sub-electrode, and a second control terminal receiving a second control signal.

7. The display device of claim 6,
wherein the second group of switches comprises:
a third switch comprising a third input terminal connected to the receiving line, a third output terminal connected to the second main electrode, and a third control terminal receiving the first control signal; and
a fourth switch comprising a fourth input terminal connected to the receiving line, a fourth output terminal connected to the second sub-electrode, and a fourth control terminal receiving the second control signal.

8. The display device,of claim 7, further comprising:
a touch driving controller configured to generate, in response to a touch pen approaching the, display panel, an uplink signal, the first control signal, and the second control signal,
wherein the first group of switches and the second group of switches are included in the touch driving controller, and
wherein the second and fourth switches are turned on in response to the second control signal, and the first and. third switches turn off in response to the first control signal so that the transmission line and the first sub-electrode are connected with each other to transmit the uplink signal to the touch pen.

9. The display device of claim 7, further comprising:
a touch driving controller configured to generate, in response to a touch pen which touches the display panel, the first control signal and the second control signal,
wherein the first group of switches and the second group of switches are included in the touch driving controller, and
wherein the first and third switches are turned on in response to the first control signal, and the second and fourth switches are turned on in response to the second control signal applied thereto at a different timing from the first control signal so that the transmission line and the receiving line receive a downlink signal transmitted from the touch pen.

10. The display device of claim 9,
wherein the first control signal is applied to the first and third switches prior to the second control signal.

11. The display device of claim 9,
wherein the second control signal is applied to the second and fourth switches prior to the first control signal.

12. The display device of claim 7, further comprising:

a touch driving controller configured to generate an uplink signal in response to a user's finger which touches the display panel, wherein the first group of switches and the second group of switches are included in the touch driving controller, and wherein the first and third switches are turned on in response to the first control signal, and wherein the second and fourth switches are turned on in response to the second control signal applied at a different timing from the first control signal.

13. The display device of claim 12, wherein a driving signal is transmitted through the transmission line, and wherein a sensing signal is outputted through the receiving line.

14. The display device of claim 1, wherein the first main electrode has a width greater than a width of the first sub-electrode in the second direction.

15. The display device of claim 14, wherein the first sub-electrode is one of a plurality of first sub-electrodes, and wherein the first main electrode is disposed between two adjacent first sub-electrodes of the plurality of first sub-electrodes.

16. The display device of claim 1, wherein the second main electrode has a width greater than a width of the second sub-electrode in the first direction.

17. The display device of claim 16, wherein the second sub-electrode is one of a plurality of second sub-electrodes, and wherein the second main electrode is disposed between two adjacent second sub-electrodes of the plurality of second sub-electrodes.

18. A display device comprising:

a display panel; and an input sensing part disposed on the display panel, the input sensing part comprising:

a first main electrode extending lengthwise in a first direction;

a plurality of first sub-electrodes extending lengthwise in the first direction and disposed adjacent to the first main electrode;

a second main electrode extending lengthwise in a second direction different from the first direction and insulated from the first main electrode and the plurality of first sub-electrodes, wherein the second main electrode overlaps the first main electrode and the plurality of first sub-electrodes;

a plurality of second sub-electrodes extending lengthwise in the second direction, disposed adjacent to the second main electrode, and insulated from the first main electrode and the plurality of first sub-electrodes, wherein the plurality of second sub-electrodes overlap the first main electrode and the plurality of first sub-electrodes;

a first transmission line connected to the first main electrode;

a first receiving line connected to the second main electrode;

a first group of switches configured to selectively connect a second transmission line and one of the plurality of first sub-electrodes with each other; and a second group of switches configured to selectively connect a second receiving line and one of the plurality of second sub-electrodes with each other.

19. The display device of claim 18, wherein the first group of switches are configured to sequentially connects the second transmission line to each of the plurality of first sub-electrodes, and wherein the second group of switches are configured to sequentially connect the second receiving line to each of the plurality of second sub-electrodes.

20. The display device of claim 18, wherein the plurality of first sub-electrodes is two first sub-electrodes, wherein the first main electrode is interposed between the two first sub-electrodes, and wherein a width of the first main electrode is smaller than a width of each of the two first sub-electrodes.

* * * * *